United States Patent [19]

Kobayashi et al.

[11] Patent Number: 5,061,979
[45] Date of Patent: Oct. 29, 1991

[54] SEMICONDUCTOR PHOTOELECTRIC DEVICE HAVING A MATRIX WIRING SECTION

[75] Inventors: Isao Kobayashi, Atsugi; Noriyuki Kaifu, Yokohama; Toshihiro Saika, Hiratsuka; Tadao Endo, Atsugi; Tetsuya Shimada, Zama, all of Japan

[73] Assignee: Canon Kabushiki Kaisha, Tokyo, Japan

[21] Appl. No.: 482,834

[22] Filed: Feb. 21, 1990

[30] Foreign Application Priority Data

Feb. 21, 1989 [JP] Japan ................................ 1-39239
Feb. 28, 1989 [JP] Japan ................................ 1-45144
Feb. 28, 1989 [JP] Japan ................................ 1-45145

[51] Int. Cl.$^5$ ............................................. H01L 27/14
[52] U.S. Cl. ......................................... 357/30; 357/32; 357/2; 357/58; 250/578.1; 250/211 R
[58] Field of Search .................. 250/578.1, 211 R; 357/30 G, 30 H, 30 D, 30 I, 30 K, 30 P, 32, 58, 2

[56] References Cited

U.S. PATENT DOCUMENTS 4,931,661 6/1990 Fukaya ........................... 250/578.1

FOREIGN PATENT DOCUMENTS 0044610 1/1982 European Pat. Off. .
0256850 2/1988 European Pat. Off. .
0263497 4/1988 European Pat. Off. .
0296603 12/1988 European Pat. Off. .

Primary Examiner—William Mintel
Attorney, Agent, or Firm—Fitzpatrick, Cella, Harper & Scinto

[57] ABSTRACT

A semiconductor device wherein m×n switch means connected to m×n functional elements for transferring signals by switching, and a matrix wiring section having wiring connected respectively to said m×n switching means are formed on a common substrate, and wherein said matrix wiring section comprises a lamination structure formed by stacking, at least, a first conductive layer, a first insulating layer, a second conductive layer, a second insulating layer, a semiconductor layer, and a third conductive layer in this order.

25 Claims, 21 Drawing Sheets

SEMICONDUCTOR PHOTOELECTRIC DEVICE HAVING A MATRIX WIRING SECTION

BACKGROUND OF THE INVENTION

1. Field of the Invention

The present invention relates to a semiconductor device and a semiconductor device using the same and having a photoelectric conversion function and, more particularly, to a semiconductor device wherein a plurality of switch means for transferring signals upon switching, and a plurality of matrix wirings respectively connected to the plurality of switch means are formed on a single substrate. Note that the semiconductor device having the photoelectric conversion function of the present invention is suitably used in an image reading apparatus serving as an input section of, e.g., a facsimile system, an image reader, a digital copying machine, an electronic chalkboard, and the like.

2. Related Background Art

In recent years, in order to realize a compact, high-performance image reading apparatus such as a facsimile system, an image reader, or the like, an elongated line sensor having an equal-magnification optical system used as a photoelectric conversion apparatus has been developed. Conventionally, in a line sensor of this type, a plurality of photoelectric conversion elements are aligned in an array, and signal processing ICs (Integrated Circuits) comprising switching elements, are connected to the photoelectric conversion elements. However, 1728 photoelectric conversion elements are required for an A4 size to comply with the facsimile G3 standards, and, hence, a large number of signal processing ICs are also required. For this reason, the number of mounting steps is also increased, resulting in high manufacturing cost and poor reliability. Thus, matrix wirings are adopted to decrease the number of signal processing ICs and to decrease the number of mounting steps.

FIG. 1 is a view for explaining a structure of a photoelectric conversion apparatus having a matrix wiring structure.

The photoelectric conversion apparatus of FIG. 1 includes a photoelectric conversion element unit 101, a scanning unit 102, a signal processing unit 103, and a matrix wiring unit 104.

FIG. 2A is a plan view of a conventional matrix wiring unit, and FIGS. 2B and 2C are sectional views taken along lines A-A' and B-B' in FIG. 2A, respectively.

The matrix wiring unit shown in FIGS. 2B and 2C includes a substrate 201, individual electrodes 202 to 205, an insulating layer 206, common lines 207 to 209, and a through hole 210 for electrically connecting each individual electrode and the common line.

In this manner, in the photoelectric conversion apparatus having an m×n matrix wiring structure, the number of signal processing circuits in the signal processing unit 103 can be decreased to be equal to the number (n) of output lines of the matrix. Therefore, the signal processing unit can be made compact, and the cost of the photoelectric conversion apparatus can be decreased.

On the other hand, in a photoelectric conversion apparatus using a thin film semiconductor, photoelectric conversion elements and thin film transistors (to be abbreviated to as TFTs hereinafter,) serving as transfer circuits are formed on a single substrate in a single process to realize a compact, low-cost photoelectric conversion apparatus. In order to realize a further compact, low-cost apparatus, a so-called lensless type photoelectric conversion apparatus, in which a sensor directly detects light reflected by an original through a transparent spacer such as glass without using an equal-magnification fiber lens array, is also proposed.

However, a conventional photoelectric conversion apparatus having a matrix wiring structure described above involves the following technical subjects to be solved.

Since a very weak output of each photoelectric conversion element is read out through matrix wirings, crosstalk occurs among output signals unless a stray capacitance formed at intersections between output individual electrodes and common lines in the matrix is sufficiently decreased. This drawback imposes strict limitations on the selection of a material as an insulating interlayer, and dimensional designs of the matrix wiring structure.

Since the matrix common lines are formed to extend along an extending direction of the apparatus, a line sensor having a width corresponding to, e.g., an A4 size has a length of 210 mm. For this reason, crosstalk also occurs among output signals unless interline capacitance between the common lines is also sufficiently decreased. If this drawback is to be simply prevented, the matrix wiring unit undesirably becomes large in size.

Furthermore, a pitch between two adjacent output individual electrodes of the photoelectric conversion elements is, e.g., as narrow as 125 µm in a photoelectric conversion apparatus having a resolution of 8 lines/mm. For this reason, crosstalk also occurs among output signals unless an interline capacitance between the individual electrodes is also sufficiently decreased.

In order to realize a photoelectric conversion apparatus, which can eliminate the above-mentioned drawbacks, is free from crosstalk among output signals, and comprises a compact matrix wiring structure, a photoelectric conversion apparatus shown in FIG. 3 is proposed. This apparatus is disclosed in, e.g., Japanese Patent Laid-Open No. 62-87864, European Patent Gazette 0256850, and the like.

FIG. 3 is a cross-sectional view showing a section of a photoelectric conversion apparatus having a matrix wiring unit according to the above-mentioned proposal.

In this case, photoelectric conversion elements, TFTs, and matrix wirings are formed on a single substrate in the same process using a thin film semiconductor.

The structure shown in FIG. 3 includes a photoelectric conversion element unit 1, an accumulation capacitor unit 2, a TFT unit 3, a portion 4 having an illumination window (shown in cross-section), a matrix wiring unit 5, a transparent spacer 6, an original 7, and a substrate 8. The photoelectric conversion element unit 1, the accumulation capacitor unit 2, the TFT unit 3, and the matrix wiring unit 5 indicate regions which are respectively occupied by a photoelectric conversion element, an accumulation capacitor, a TFT, and a matrix wiring formed on the substrate. Incident light indicated by an arrow 9 propagates through the illumination window (shown in cross-section), and irradiates the photoelectric conversion element unit 1 as reflected light 10.

Information light incident on the photoelectric conversion element unit 1 is converted to a photocurrent, and is accumulated in the accumulation capacitor unit 2 as electrical charges. After the lapse of a predetermined period of time, charges accumulated in the accumulation capacitor unit 2 are transferred by the TFT unit 3 toward the matrix wiring unit 5.

On the substrate 8, a first conductive layer 12 of Al, Cr, or the like, a first insulating layer 13 of SiN, SiO$_2$, or the like, amorphous silicon hydride (to be abbreviated to as an a-Si:H hereinafter) layer 14, an n$^+$-type a-Si:H doping layer 15, a second conductive layer 16 of Al, Cr, or the like, a second insulating layer 17 of a polyimide film or an SiN or SiO$_2$ film, and a third conductive layer 18 of Al, Cr, or the like are sequentially formed.

The matrix wiring unit 5 includes individual signal wirings 19 and common signal wirings 18. A conductive layer 20, which can keep a constant potential, is formed on each intersection between the individual and common signal wirings 19 and 18 to be vertically sandwiched therebetween through the insulating layers 13 and 17.

In order to form the photoelectric conversion apparatus, the first conductive layer 12 of Al, Cr, or the like is deposited on the transparent substrate 8 of, e.g., glass by sputtering or deposition, and is patterned into a desired shape. The first insulating layer 13 of silicon nitride (SiN), the a-Si:H layer 14, and the n$^+$-type a-Si:H doping layer 15 are formed on the resultant structure by a known technique, e.g., plasma CVD. Thereafter, these three layers 13, 14, and 15 are patterned into a desired shape. Furthermore, the second conductive layer 16 of Al, Cr, or the like is formed by sputtering, deposition, or the like, and is patterned into a desired shape. In this case, the n$^+$-type a-Si:H doping layer 15 formed in the gap portion of the photoelectric conversion element and the channel portion of the TFT is removed by etching. Thereafter, the second insulating layer 17 of a polyimide film or an SiN film is formed on the second conductive film 16, and a contact hole is then formed. The resultant structure is patterned into a desired shape, as needed. Finally, the third conductive layer 18 of Al, Cr, or the like is formed on the second insulating layer 17 by sputtering, deposition, or the like, and is patterned into a desired shape.

In the photoelectric conversion apparatus manufactured in the above steps, the conductive layer 20, which can keep a constant potential is formed at each intersection between the individual and common signal wirings 19 and 18 excluding the through hole portion, so that formation of a stray capacitance between the individual and command signal wirings is prevented. In addition, although not shown, a wiring layer, which can keep a constant potential is formed between the individual and common signal wirings, so that formation of interline capacitances between the individual signal wirings and between the common signal wirings can be prevented. Therefore, the lines can be prevented from being capacitively coupled, and crosstalk among output signals can be avoided.

However, even in a photoelectric conversion apparatus with the above structure in which a conductive layer which can keep a constant potential is formed at each intersection between individual and common signal wirings, the following technical subjects are still left unsolved.

In this structure, a stray capacitance between the individual and common signal wirings can be suppressed. However, a new stray capacitance is formed between the conductive layer, for keeping a constant potential, and each individual signal wiring, and between the conductive layer and each common signal wiring.

Since the conductive layer for keeping a constant potential is formed on the entire surface of the matrix signal wiring unit excluding the through hole portions, the stray capacitance is formed in all the portions between the individual signal wirings and the conductive layer and between the common signal wirings and the conductive layer, and is not negligible in a practical application to realize a high-performance apparatus.

This problem will be described below with reference to FIG. 4. FIG. 4 shows an equivalent circuit of an accumulation type photoelectric conversion apparatus using a matrix wiring structure having a conductive layer for keeping a constant potential.

For example, when the matrix signal wirings are used at the output side of the accumulation type photoelectric conversion apparatus shown in FIG. 4, a stray capacitance 404 which is not negligible as compared to the value of a load capacitor 405 is generated, and transfer efficiency may be decreased.

In contrast to this, an S/N ratio, a dynamic range, and the like may be improved by increasing the capacitance of a accumulation capacitor 403. However, dimensions of the substrate of the photoelectric conversion apparatus are increased by an increase in accumulation capacitance, and the number of substrates per manufacturing batch is decreased. Note that reference numeral 401 designates a signal source, and 402 designates a switching means.

FIG. 5 and FIGS. 6A, 6B, and 6C are schematic cross-sectional views of European Patent Gazette 0296603 proposed by the present applicant.

An accumulation capacitance and a wiring unit are formed on the same portion on a substrate to decrease the width of the substrate of the photoelectric conversion apparatus.

A pattern arrangement of a photoelectric conversion apparatus will be described below with reference to FIG. 5.

In FIG. 5, a wiring pattern of a first layer, as a lowermost layer, is indicated by broken lines, a wiring pattern of a second layer is indicated solid lines, and a wiring pattern of a third layer, as an uppermost layer, is indicated by hatching.

The pattern shown in FIG. 5 includes a signal line matrix wiring unit 613, sensors 614, accumulation capacitances 616 formed in the signal line matrix wiring unit 613 and a gate wiring unit 619, transfer TFTs 617, reset TFTs 618, and illumination windows 620.

FIG. 6A is a cross-sectional view taken along a line A-A' in FIG. 5, FIG. 6B is a cross-sectional view taken along a line B-B' in FIG. 5, and FIG. 6C is a cross-sectional view taken along a line C-C' in FIG. 5.

The structure shown in FIGS. 6A to 6C includes a glass substrate 301, an insulating layer 303, an a-Si:H layer 304, an n$^+$-type a-Si:H doping layer 305, a first electrode layer 307, a second electrode layer 306 for forming gate electrodes, sensor gate electrodes of the accumulation capacitors, and the like. The structure also includes a second insulating layer 308, a third electrode layer 309 for deriving a wiring in a longitudinal direction of the substrate, and a transparent protection layer 310.

In the conventional photoelectric conversion apparatus, the thicknesses of the first insulating layer, the a-Si:H layer, and the n$^+$-type a-Si:H doping layer are set to be values to satisfactorily obtain photoelectric conversion characteristics in the photoelectric conversion element unit, switching characteristics in the TFT unit, capacitor characteristics in the accumulation capacitor unit. The thicknesses of these layers are respectively about 0.3 μm, 0.6 μm, and 0.15 μm. The second conductive layer must have a thickness of about 1 μm since a signal from the photoelectric conversion element must be transferred to an individual signal wiring in the matrix signal wiring unit through the three layers having the film thicknesses described above.

Therefore, the second insulating layer must have a thickness of about 2 to 3 μm to cover and flatten steps of the photoelectric conversion element unit, the TFT unit, and the matrix signal wiring unit.

However, in the conventional photoelectric conversion apparatus with the matrix wiring unit, the following technical subjects are left unsolved.

More specifically, when the second insulating layer comprises an inorganic insulating film of SiN, mirocracks are formed on the photoelectric conversion element unit, the TFT unit, and especially, in the stepped portions of the matrix wiring unit. As the film thickness is increased, internal stress in the film is increased, and the film may be peeled.

When the second insulating layer comprises an organic insulating film of polyimide, it can be formed with good step coverage without causing microcracks. However, it is difficult to form contact holes.

Methods of forming contact holes can be largely classified into wet etching and dry etching.

(1) Wet Etching

A hydrazinolysis method has a feature of etching a completely hardened polyimide-based resin film, and can form micro contact holes with good reproducibility. However, a hydrazine aqueous solution may damage semiconductor layers or the like in the photoelectric conversion unit and the TFT unit.

Methods of using a developing solution of a resist include two different processes using positive and negative photoresists. When a positive resist is used, a polyimide semi-hardened film is formed in a pretreatment, and the polyimide resin film is etched simultaneously with development of the resist by utilizing the fact that the developing solution can etch the semi-hardened film. For this reason, the number of steps can be advantageously decreased. However, an etching rate has large pretreatment temperature dependency, and strict process control is difficult to achieve. In addition, the semi-hardened film, semiconductor layers, and the like may be damaged by a resist remover. On the other hand, when the negative resist is used, since contactness between the semi-hardened film and the resist is better than that of the positive resist, process controllability is slightly improved. However, the adverse influence of the resist remover is left unsolved.

(2) Dry Etching

With $O_2$ plasma dry etching method, micro contact holes can be formed. However, this method has a problem of an unstable etching rate, and, hence, process control is not easy. In some methods, in order to cope with such a problem, a resist film may be formed to be thicker than the polyimide resin film using a positive resist as a mask. In this case, the resist film must have a film thickness of about 5 μm, and it is very difficult to perform stable micropatterning.

SiN or $SiO_2$ may be used as a mask. However, the SiN or $SiO_2$ film must be patterned, resulting in a long process.

SUMMARY OF THE INVENTION

It is an object of the present invention to provide a semiconductor device which can solve the above technical subjects, is free from crosstalk among output signals, and has a high S/N ratio and a wide dynamic range.

It is another object of the present invention to provide a compact semiconductor device which has high stability made by a simple manufacturing process.

It is still another object of the present invention to provide a semiconductor device in which a plurality of switch means are provided for transferring signals upon switching. A plurality of matrix wirings are respectively connected to the plurality of switch means are formed on a single substrate. The matrix wirings are constituted by a multilayered structure of at least a first conductive layer, a first insulating layer provided on the first conductive layer, a second conductive layer provided on the first insulating layer, a second insulating layer provided on the second conductive layer, a semiconductor layer provided on the second insulating layer, and a third conductive layer provided on the semiconductor layer in the order named.

It is still another object of the present invention to provide a semiconductor device having a photoelectric conversion function in which switch means are connected in units of a plurality of photoelectric conversion elements. All the photoelectric conversion elements are divided into a plurality of blocks to form matrix wirings, and the switch means are operated for each block to output an image signal.

The matrix wirings are constituted by a multilayered structure having at least a first conductive layer, a first insulating layer, a second conductive layer, a second insulating layer, a semiconductor layer, and a third conductive layer.

It is still another object of the present invention to provide a semiconductor device in which charge accumulation means, a switch means connected to the charge accumulation means, and a matrix wirings connected to the switch means are formed on a single substrate.

The matrix wirings and the charge accumulation means are constituted by a multilayered structure having at least a first conductive layer, a first insulating layer provided on the first conductive layer, a second conductive layer provided on the first conductive layer, a second insulating layer provided on the first conductive layer, a semiconductor layer provided on the first conductive layer, and a third conductive layer provided on the semiconductor layer. Each corresponding layer of the matrix wirings and each layer of the charge accumulation means are formed by the same layer.

It is still another object of the present invention to provide a semiconductor device having a photoelectric conversion function, in which photoelectric conversion elements, charge accumulation means for accumulating signal charges from the photoelectric conversion elements, switch means connected to the charge accumulation means, and matrix wirings connected to the switch means are formed on a single substrate.

The matrix wirings and the charge accumulation means are constituted by a multilayered structure of at least a first conductive layer, a first insulating layer provided on the first conductive layer, a second conductive layer provided on the first insulating layer, a second insulating layer provided on the second conductive layer, a semiconductor layer provided on the second insulating layer, and a third conductive layer provided on the semiconductor layer. Each layer of the matrix wirings and each corresponding layer of the charge accumulation means are formed by the same layer.

It is still another object of the present invention to provide a semiconductor device in which charge accumulation means, switch means connected to the charge accumulation means, and matrix wirings connected to the switch means are formed on a single substrate.

The matrix wirings are constituted by a multilayered structure of at least a first conductive layer provided on the first conductive layer, a first insulating layer, a second conductive layer provided on the first insulating layer, a second insulating layer provided on the second conductive layer, a semiconductor layer provided on the second insulating layer, and a third conductive layer provided on the semiconductor layer. Each charge accumulation means is formed by at least the first conductive layer, the first insulating layer the second conductive layer, and The first conductive layers, the first insulating layers, and the second conductive layers of the matrix wirings and the charge accumulation means are formed by the same layers, respectively.

It is still another object of the present invention to provide a semiconductor device having a photoelectric conversion function, in which photoelectric conversion elements, charge accumulation means for accumulating signal charge from the photoelectric conversion elements, switch means connected to the charge accumulation means, and matrix wirings connected to the switch means are formed on a single substrate.

The matrix wirings are constituted by a multilayered structure of at least a first conductive layer provided on the first conductive layer, a first insulating layer, a second conductive layer provided on the first insulating layer, a second insulating layer provided on the semiconductor layer, a semiconductor layer provided on the second insulating layer.

Each charge accumulation means is formed by at least the first conductive layer, the first insulating layer, and the second conductive layer.

The first conductive layers, the first insulating layers, and the second conductive layers of the matrix wirings and the charge accumulation means are formed by the same layers, respectively.

Figure 1:
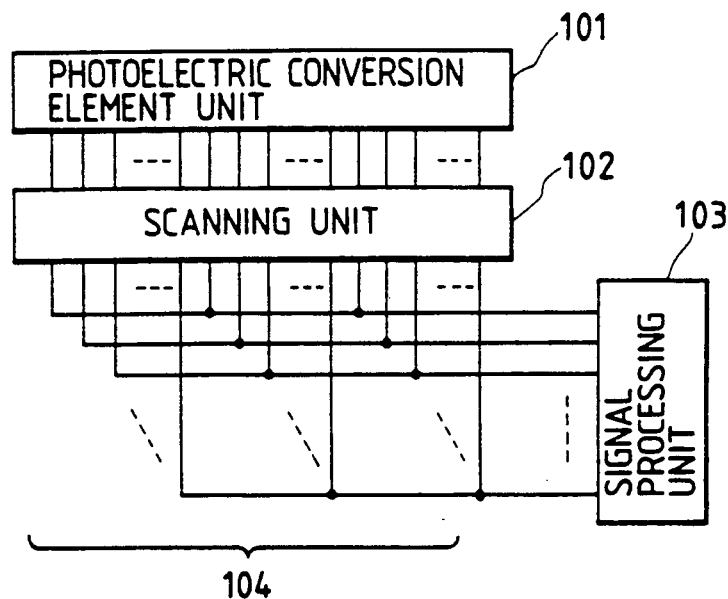
FIG. 1 is a view for explaining a structure of a photoelectric conversion apparatus.
Figure 2A:
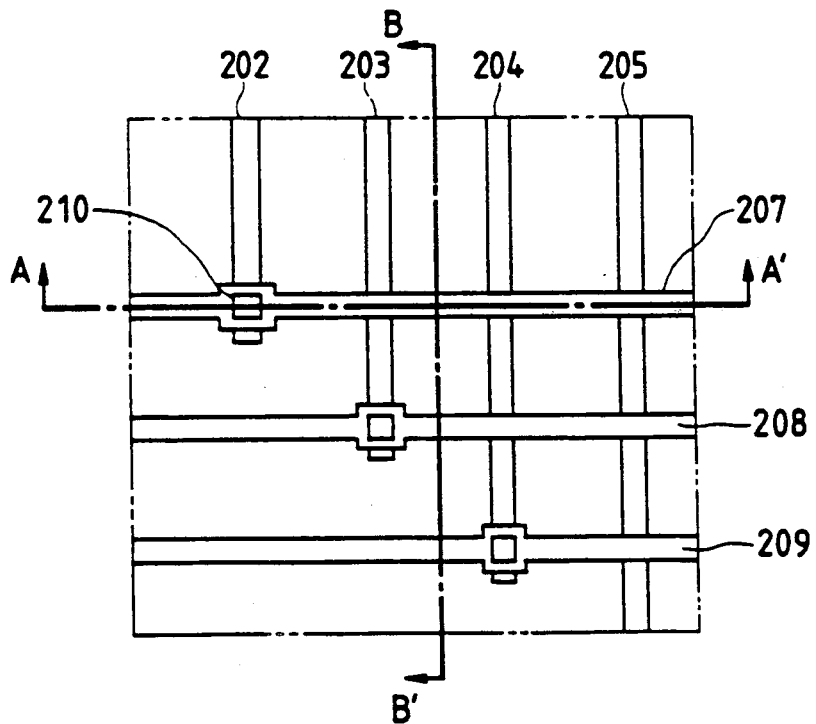
FIG. 2A is a plan view of a conventional matrix wiring unit.
Figure 2B:
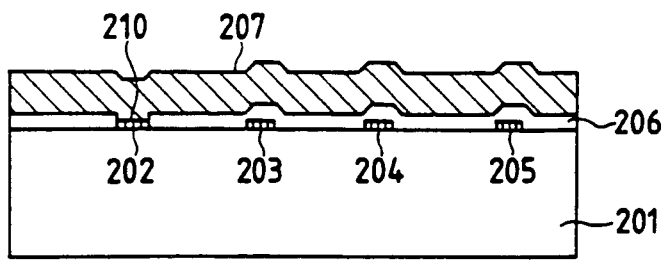
FIGS. 2B and 2C are cross-sectional views taken along lines A-A' and B-B' in FIG. 2A.
Figure 2C:
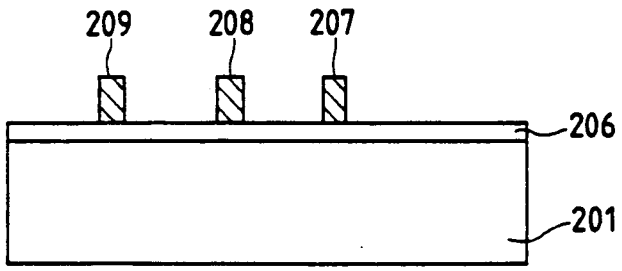

DETAILED DESCRIPTION OF THE PREFERRED EMBODIMENTS:

Preferred Embodiments of the present invention will be described hereinafter.

In a conventional semiconductor device, matrix wirings are constituted by sequentially stacking a first conductive layer, a first insulating layer, a semiconductor layer, a second conductive layer, a second insulating layer, and a third conductive layer. The second insulating film must have at least predetermined film thickness due to steps of layers under the second insulating layer, and contact holes must be formed in the second insulating layer, thus posing various problems. In consideration of this, in a semiconductor device according to the present invention, matrix wirings are constituted to have a multilayered structure of at least a first conductive layer, a first insulating layer, a second conductive layer, a second insulating layer, a semiconductor layer, and a third conductive layer formed in that order named. The steps of layers under the second insulating layer are made small, and the film thickness of the second insulating layer is decreased so as to facilitate formation of contact holes.

In a photoelectric conversion apparatus according to the present invention, the above-mentioned semiconductor device is used in a photoelectric conversion apparatus in which switch means are connected in units of a plurality of photoelectric conversion elements, all the photoelectric conversion elements are divided into a plurality of blocks to form matrix wirings, and the switch means are operated for each block to output an image signal.

In a semiconductor device according to the present invention, the matrix wirings and charge accumulation means are formed by a multilayered structure of at least a first conductive layer, a first insulating layer, a second conductive layer, a second insulating layer, a semiconductor layer, and a third conductive layer in the order named, and each layer of the matrix wirings and each corresponding layer of the charge accumulation layer are formed by the same layer.

The steps of layers under the second insulating layer are made small. The film thickness of the second insulating layer is decreased so as to facilitate formation of contact holes, and the charge accumulation means are constituted in a two-storied structure to constitute parallel connections. Thereby a capacitance of the charge accumulation means is increased without increasing the size of the substrate.

In a photoelectric conversion apparatus according to the present invention, the above-mentioned semiconductor device is used in a photoelectric conversion apparatus in which photoelectric conversion elements. A charge accumulation means accumulates signal charges from the photoelectric conversion elements, switch means connected to the charge accumulation means, and matrix wirings connected to the switch means are formed on a single substrate.

In a semiconductor device according to the present invention, the matrix wirings are constituted by a multilayered structure of at least a first conductive layer, a first insulating layer, a second conductive layer, a second insulating layer, a semiconductor layer, and a third conductive layer in the order named.

Each charge accumulation means is formed by at least the first conductive layer, the first insulating layer. The second conductive layer, and The first conductive layers, the first insulating layers, and the second conductive layers of the matrix wirings and the charge accumulation means are formed by the same layers, respectively, Steps of layers under the second insulating layer are made small, and the film thickness of the second insulating layer is decreased so as to facilitate formation of contact holes. A dielectric portion of the charge accumulation means is constituted by the first insulating layer without increasing the size of the substrate, and the thickness of the dielectric portion is decreased to increase a capacitance of the charge accumulation means.

In a photoelectric conversion apparatus according to the present invention, the above-mentioned semiconductor device is used in a photoelectric conversion apparatus in which photoelectric conversion elements. A charge accumulation means is provided for accumulating signal charges from the photoelectric conversion elements. A switch means is connected to the charge accumulation means, and matrix wirings are connected to the switch means are formed on a single substrate.

FIRST EMBODIMENT

The first embodiment of the present invention will be described below with reference to the accompanying drawings.

Note that a semiconductor device of the present invention is not always limited to a photoelectric conversion apparatus. The photoelectric conversion apparatus will be exemplified below as a preferred embodiment.

Figure 7:
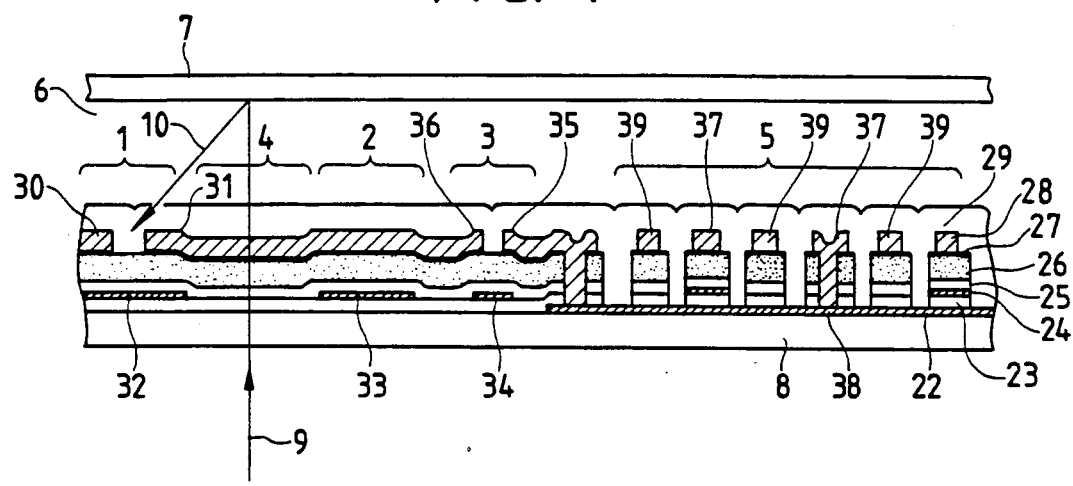
FIG. 7 is a cross-sectional view of a photoelectric conversion apparatus according to the first embodiment of the present invention.

FIG. 7 is a cross-sectional view of a photoelectric conversion apparatus according to the first embodiment of the present invention.

Figure 3:
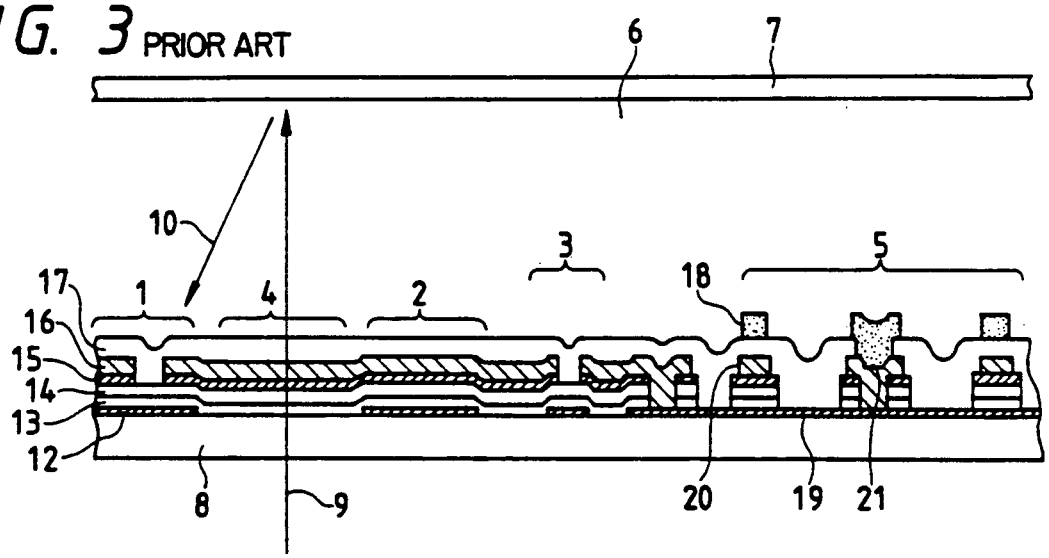
FIG. 3 is a cross-sectional view showing a section of a photoelectric conversion apparatus having a matrix wiring unit according to the above-mentioned proposal.
Figure 4:
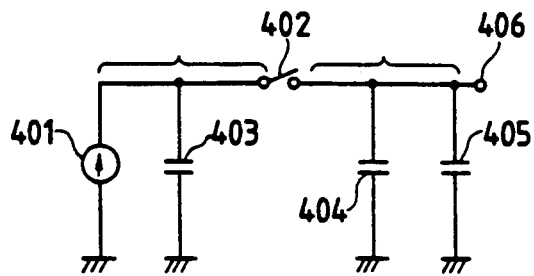
FIG. 4 shows an equivalent circuit of an accumulation type photoelectric conversion apparatus using a matrix wiring structure.
Figure 5:
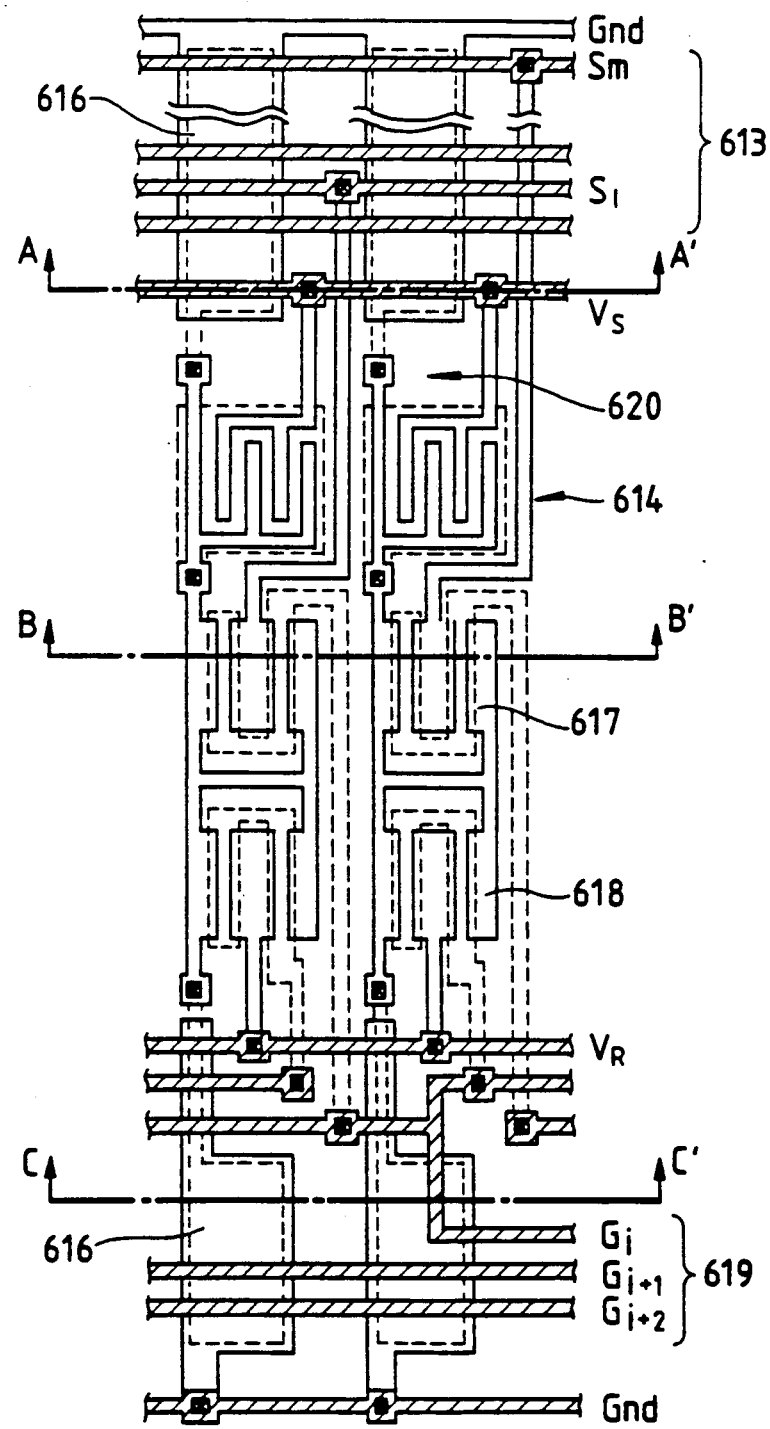
FIG. 5 is a plan view showing an example of pattern arrangement of a photoelectric conversion apparatus of the prior art.

In the photoelectric conversion apparatus of this embodiment, a photoelectric conversion unit, an accumulation capacitor unit, a TFT unit, a matrix wiring unit, and the like are integrally formed on an insulating substrate in the same process using a-Si:H of an amorphous material as a semiconductor layer. The same reference numerals in FIG. 7 denote the same parts as in FIG. 3.

The structure shown in FIG. 7 includes a photoelectric conversion element unit 1, an accumulation capacitor unit 2, a TFT unit 3, a portion 4 having an illumination window (not shown) of incident light, a matrix wiring unit 5, a transparent spacer 6, an original 7, and a substrate 8. Incident light indicated by an arrow 9 illuminates the original 7 through the illumination window (not shown), and reaches the photoelectric conversion element unit 1 as reflected light 10 (i.e., information light).

The information light incident on the photoelectric conversion element unit 1 is converted to a photocurrent, and is accumulated in the accumulation capacitor unit 2 as electrical charges. After the lapse of a predetermined period of time, charges accumulated in the accumulation capacitor unit 2 are transferred by the TFT unit 3 toward the matrix wiring unit 5 as a multilayered wiring unit.

On the substrate 8, a first conductive layer 22 of Al, Cr, or the like, a first insulating layer 23 of, e.g., SiN, a second conductive layer 24 of Al, Cr, or the like, a second insulating layer 25 of, e.g., SiN, a semiconductor layer 26 of a-Si:H, an n+-type a-Si:H ohmic contact layer 27 in which an impurity is heavily doped, a third conductive layer 28 of Al, Cr, or the like, and a protective layer 29 of, e.g., polyimide are formed.

The photoelectric conversion element unit 1 includes upper electrode wiring layers 30 and 31. The light 10 reflected by an original surface causes a conductivity of the a-Si:H photoconductive semiconductor 26 to change, thereby changing a current flowing between the interdigitally opposing upper electrode wiring layers 30 and 31. Note that reference numeral 32 designates a metal light-shielding layer. The layer 32 may be connected to an appropriate drive source to serve as a gate electrode as a control electrode for the main electrodes 30 (source side) and 31 (drain side).

The accumulation capacitor unit 2 is constituted by: a lower electrode wiring layer 33; a dielectric constituted by the second insulating layer 25 formed on the lower electrode wiring layer 33 and by the photoconductive semiconductor layer 26; and wiring layers formed on the photoconductive semiconductor layer 26 and contiguous with the upper electrode wiring layer 31 of the photoelectric conversion element unit 1. The accumulation capacitor unit 2 has a so-called MIS (Metal-Insulator-Semiconductor) capacitor structure. Either positive or negative bias conditions may be used. The unit 2 is used while the lower electrode wiring layer 33 is kept negatively biased, thus obtaining stable capacitance and frequency characteristics.

The TFT unit 3 comprises a lower electrode wiring layer 34 serving as a gate electrode, the second insulating layer 25 constituting a gate insulating layer, the semiconductor layer 26, an upper electrode wiring layer 35 serving as a source electrode, an upper electrode wiring layer 36 serving as a drain electrode, and the like. This TFT unit is a lower gate stagger type FET.

In the matrix wiring unit 5, individual signal wirings 22 each formed of the first conductive layer the first insulating layer 23 covering the individual signal wiring layer, the second conductive layer 24 whose potential is kept constant by a voltage source (not shown), the second insulating layer 25 formed on the second conductive layer, the semiconductor layer 26, the heavily doped a-Si:H ohmic contact layer 27, and common signal wirings 37 which cross the individual signal wirings and are formed of the third conductive layer are sequentially stacked on the substrate 8. Reference numeral 38 designates a contact hole for forming an ohmic contact between the individual wirings 22 and the common signal wirings 37. Reference numeral 39 designates interline shielding wirings which are formed between adjacent common signal wirings and on two sides of each common signal wiring, and are maintained at a constant potential by a voltage source (not shown).

As described above, in the photoelectric conversion apparatus of this embodiment, all of the constituting units, i.e., the photoelectric conversion element unit, the accumulation capacitor unit, the TFT unit, and the matrix wiring unit have the multilayered structure of the photoconductive semiconductor, the insulating layers, the conductive layers, and the like, and these units can be simultaneously formed in the same process.

The second conductive layer which can be kept at a constant potential is formed on the intersection between the output individual and common signal wirings, thereby eliminating a stray capacitance formed in the intersection between the individual and common signal wirings. Furthermore, the shielding wirings which can keep a constant potential are formed between the adjacent common signal wirings and on two sides of each common signal wiring, thus preventing formation of a capacitance between adjacent common signal wirings.

Note that the shielding wirings which can be kept at a constant potential may be formed between the adjacent common signal wirings, so that formation of a capacitance between adjacent individual signal wirings can also be prevented.

FIGS. 8A to 8H are cross-sectional views showing steps in the manufacture of the embodiment shown in FIG. 7. The step in the manufacture of this embodiment will be described below with reference to FIGS. 8A to 8H.

Figure 8A:
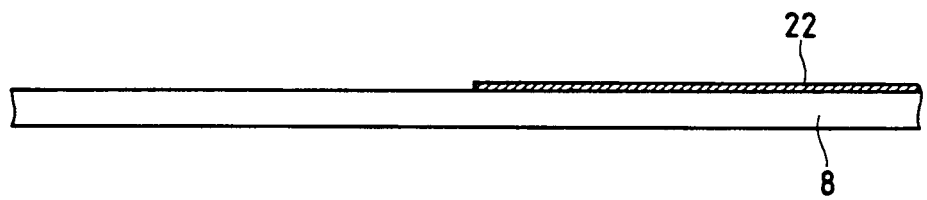
FIGS. 8A to 8H are cross-sectional views showing steps in the manufacture of the embodiment shown in FIG. 7.

As shown in FIG. 8A, a 0.1-μm thick first conductive layer 22 of Al, Cr, or the like was deposited on a transparent substrate 8 of, e.g., glass by sputtering or deposition, and was patterned into a desired shape.

Figure 8B:
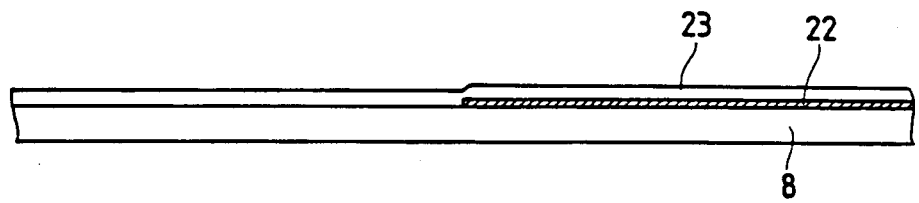

As shown in FIG. 8B, a 0.3-μm thick first insulating layer 23 of silicon nitride (SiN) was formed on the structure shown in FIG. 8A by a known technique such as plasma CVD.

Figure 8C:
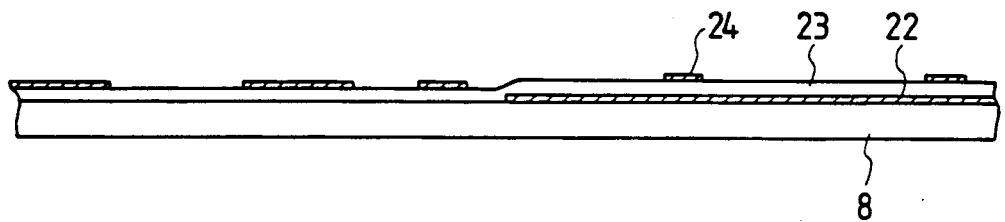

As shown in FIG. 8C, a 0.1-μm, thick second conductive layer 24 of Al, Cr, or the like was deposited by sputtering or deposition, and was patterned to a desired shape.

Figure 8D:
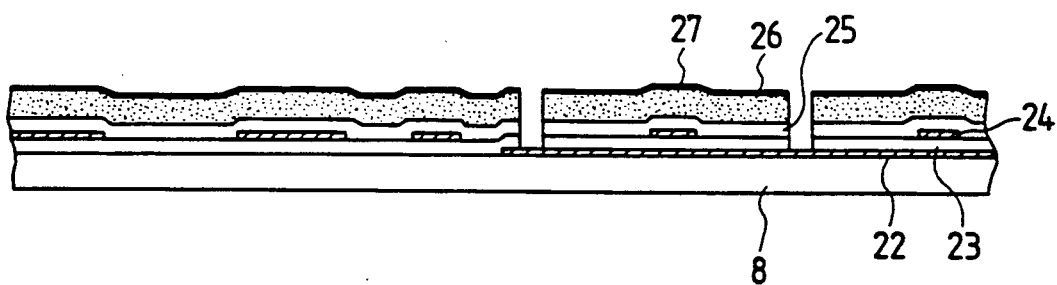

As shown in FIG. 8D, a 0.3-μm thick second insulating layer 25 of SiN, a 0.6-μm thick a-Si:H layer 26, and a 0.15-μm thick n+-type a-Si:H doping layer 27 were formed by a known technique, e.g., plasma CVD, and these three layers 25, 26, and 27 were patterned to form contact holes.

Figure 8E:
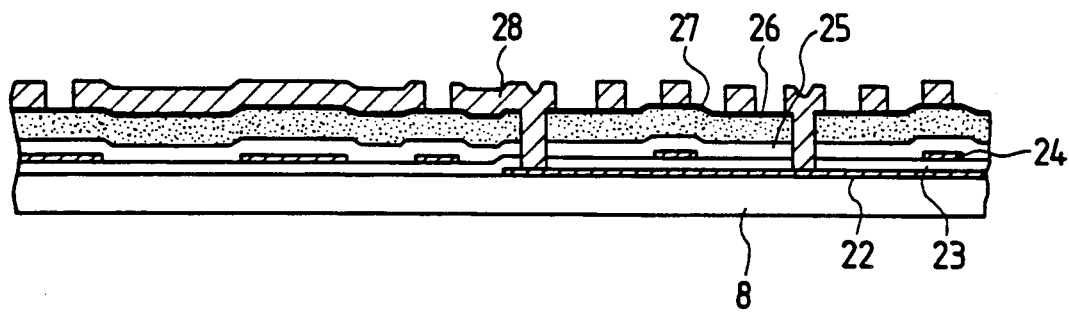

As shown in FIG. 8E, a third conductive layer 28 of Al, Cr, or the like was formed by sputtering or deposition, and was patterned into a desired shape.

Figure 8F:
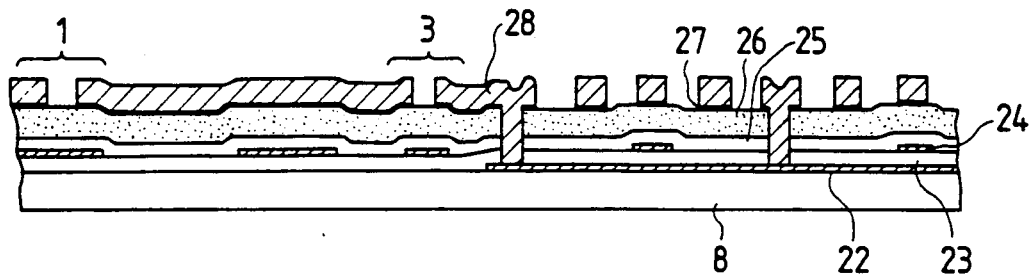
Figure 8G:
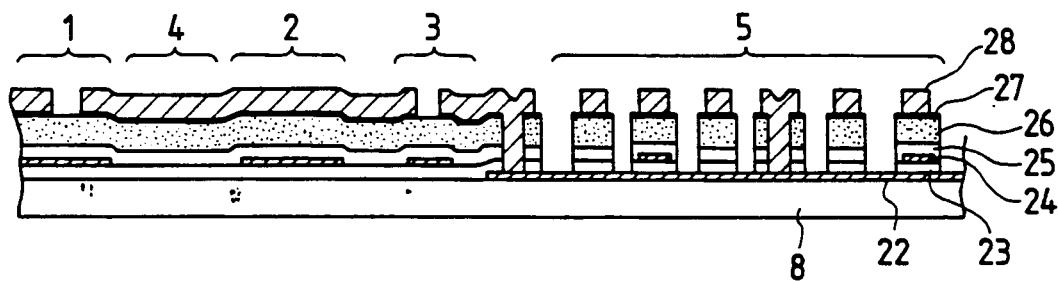

As shown in FIG. 8F, the n+- layer a-Si:H doping layers on the gap portion of the photoelectric conversion element unit 1 and the channel portion of the TFT unit 3 were removed by etching. As shown in FIG. 8G, an unnecessary semiconductor layer was removed to divide the structure so that respective elements were electrically isolated from each other in units of bits, i.e., element isolation was performed.

Figure 8H:
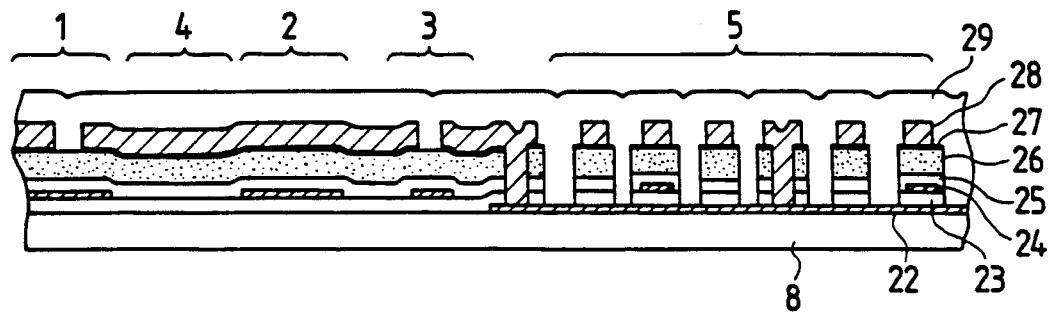

Thereafter, as shown in FIG. 8H, a third insulating layer 29 of a polyimide film or an SiN film as a protective layer was formed on the third conductive layer 28.

As described above, in the photoelectric conversion apparatus of this embodiment in which the photoelectric conversion element unit, the TFT unit, and the matrix wiring unit are formed on a single substrate. The matrix wiring unit is constituted by a multilayered structure of the first conductive layer, the first insulating layer, the second conductive layer, the second insulating layer, the semiconductor layer, and the third insulating layer which are sequentially stacked on the substrate. Of these layers, the second conductive layer is formed by the same layer as that constituting the gate electrode, the second insulating layer is formed by the same layer as that constituting the gate insulating film of the TFT, the semiconductor layer is formed by the same layer as that constituting the photoconductive semiconductor layer of the photoelectric conversion element unit and that constituting the semiconductor layer of the TFT unit, and the third conductive layer is formed by the same layer as that constituting the source/drain electrode of the TFT unit.

According to the structure of the present invention, the second insulating layer which requires a film thickness of about 2 to 3 μm in a conventional structure need only have a thickness capable of covering a stepped portion of the second conductive layer and keeping good switching characteristics of the TFT. Thus, since the second insulating layer normally has a film thickness of about 0.3 μm, it can become a good film free from microcracks.

It is conventionally difficult to form a contact hole for achieving an ohmic contact between the third and first conductive layers. However, according to the structure of the present invention, the same process as in the step of forming a contact hole for achieving an ohmic contact between the second and first conductive layers can be used, and stable micropatterning can be realized by a simple process.

The reading operation of the photoelectric conversion apparatus of the present invention will be described below.

Figure 9:
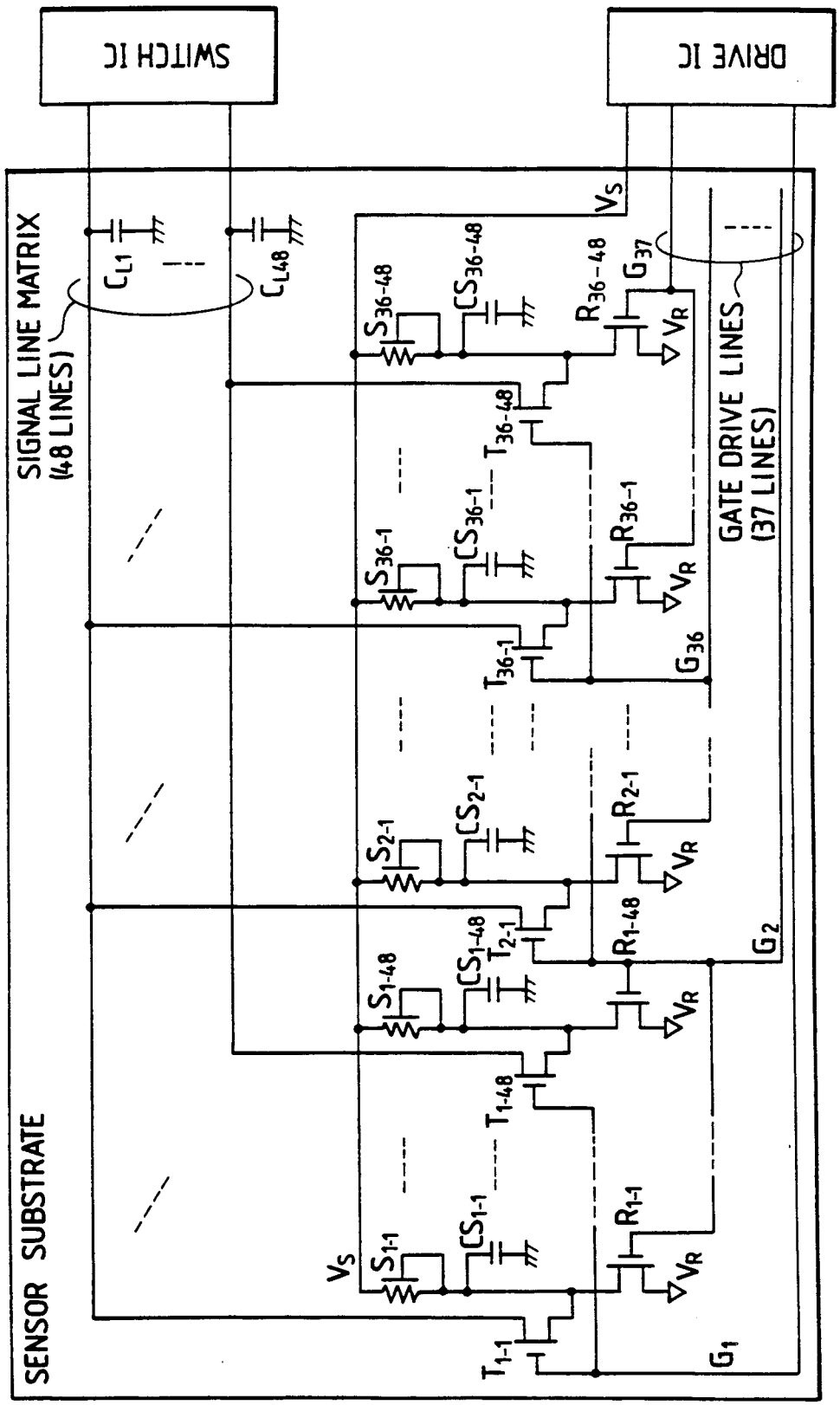
FIG. 9 is an equivalent circuit diagram of the photoelectric conversion apparatus of the present invention.

FIG. 9 is an equivalent circuit diagram of the photoelectric conversion apparatus of the present invention.

Light information incident on the photoelectric conversion elements is converted into 48-bit parallel voltage outputs through the accumulation capacitors, the transfer TFTs, the reset TFTs, and the matrix wirings. The 48-bit parallel voltage outputs are then converted into serial signals by a switch IC, and the serial signals are output to an external circuit.

In this embodiment, the photoelectric conversion elements of 1,728 bits (a total of pixels) are divided into m, i.e., 36 blocks in units of n, i.e., 48 bits to allow m×n matrix driving operations. Each operation is performed in units of blocks.

Light information incident on photoelectric conversion elements S1-1 to S1-48 is converted into photocurrents, and is accumulated in accumulation capacitors CS1-1 to CS1-48 as charges. After the elapse of a predetermined period of time, a voltage pulse is applied to a gate drive line G1 to enable transfer TFTs T1-1 to T1-48. Thus, the charges in the accumulation capacitors CS1-1 to CS1-48 are transferred to load capacitors CL1-1 to CL1-48 through matrix signal lines. In this case, as described above, shield wirings for keeping a constant potential are formed between adjacent matrix common wirings, so that the wirings can be prevented from being capacitively coupled to each other, and no crosstalk occurs among output signals. Furthermore, the shield wirings are formed on two sides of the matrix common wirings, thus eliminating variations in wirings.

Subsequently, signal outputs of the first block, which are transferred to the load capacitors CL1-1 to CL1-48, are converted to serial signals by a switch IC, and are then output to an external circuit after impedance conversion. At the same time, the charges in the load capacitors CL1-1 to CL1-48 are reset.

A voltage pulse is applied to a gate drive line G2, thus starting a transfer operation of the second block. Similarly, the reset TFTs R1-1 to R1-48 are enabled, and the charges in the accumulation capacitors CS1-1 to CS1-48 are reset to prepare for the next read access.

Gate drive lines G3, G4, . . . are sequentially driven to output 1-line data.

SECOND EMBODIMENT

Figure 10:
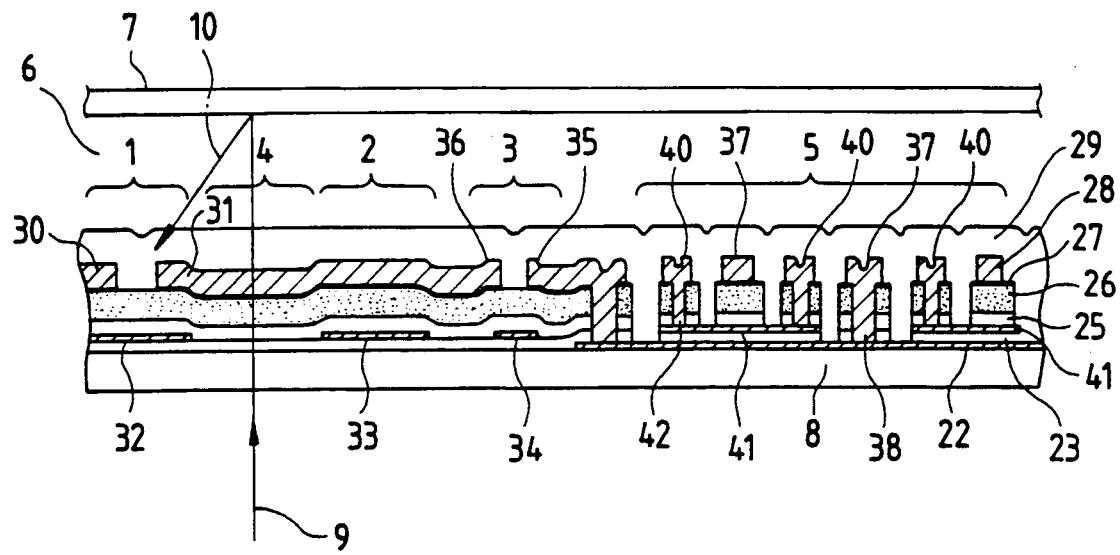
FIG. 10 is a crosssectional view showing the second embodiment of a photoelectric conversion apparatus of the present invention.

FIG. 10 is a cross-sectional view showing the second embodiment of a photoelectric conversion apparatus of the present invention. The same reference numerals in FIG. 10 denote the same parts as in the first embodiment shown in FIG. 7.

The characteristic feature of this embodiment is that interline shield wirings 40 formed between adjacent common signal lines 37 and intersection shield wirings 41 formed on intersections between individual signal wirings 22 and the common signal lines 37 are brought into ohmic contact with each other through contact holes 42.

As described above, according to the present invention, a second insulating layer 25 must satisfy a function of a gate insulating film of a TFT unit 3, and a function of an insulating interlayer of a matrix wiring unit 5 at the same time. Thus, the second insulating layer 25 is required to have a thin-film structure having a thickness of about 0.3 μm, ,which is free from microcracks. Therefore, a structure for decreasing the film thickness of a second conductive layer causing stepped portions is required to minimize the stepped portion.

The second conductive layer must exhibit a function of intersection shield wirings 41 for eliminating capacitive coupling of the individual signal wirings 22 and the common signal wirings 37 at intersections therebetween. However, when the thickness of the second conductive layer is decreased, a shield function may be degraded upon an increase in wiring resistance.

This embodiment is achieved to take a countermeasure against such problems. In this embodiment, the intersection shield wirings 41 and adjacent interline shield wirings 40 are brought into ohmic contact with each other through the contact holes 42.

THIRD EMBODIMENT

Figure 11:
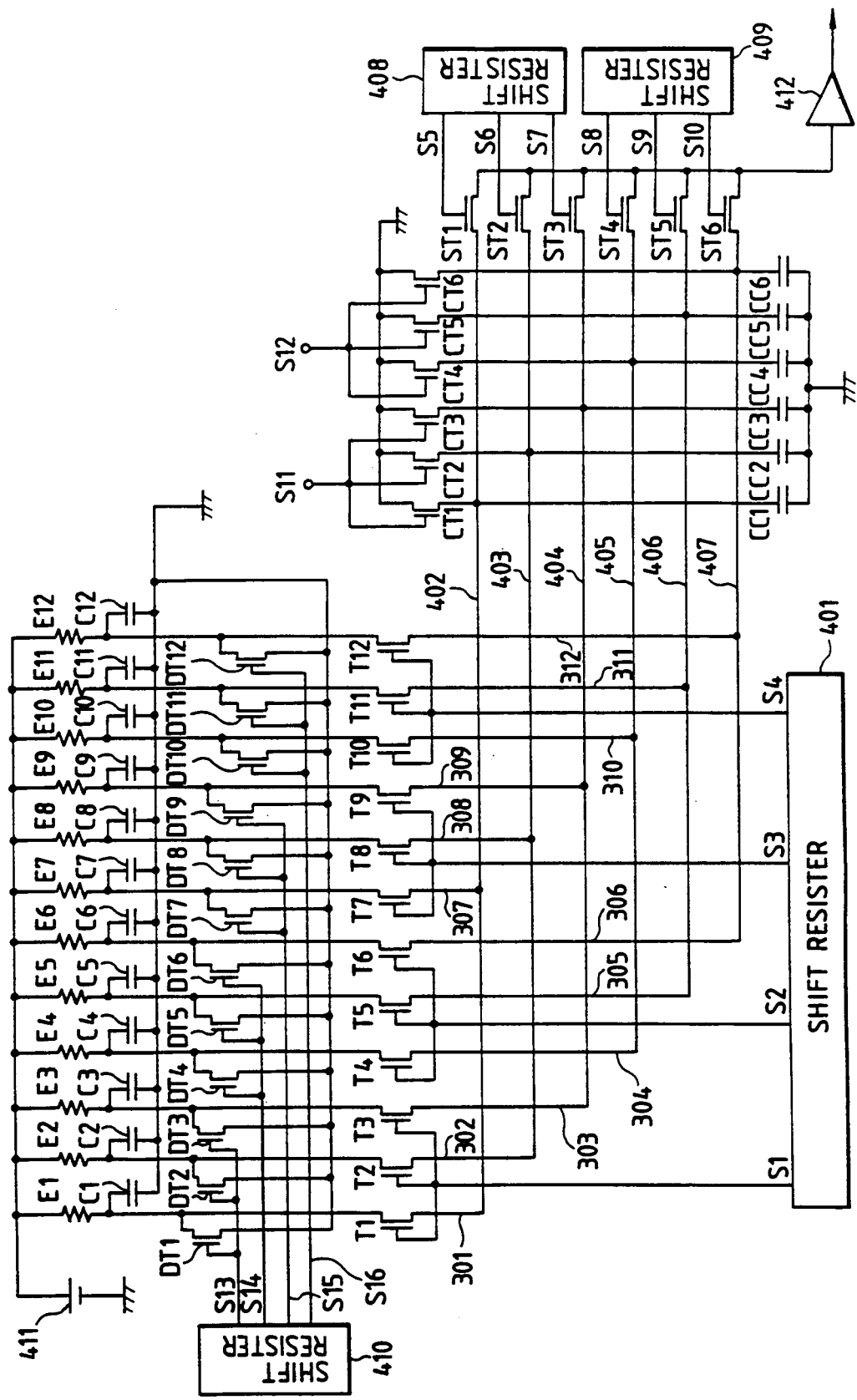
FIG. 11 is a equivalent circuit diagram of the third embodiment of a photoelectric conversion apparatus according to the present invention.

FIG. 11 is an equivalent circuit diagram of the third embodiment of a photoelectric conversion apparatus according to the present invention. This embodiment exemplifies a case wherein the apparatus has 12 photoelectric conversion elements.

The sectional structure of the photoelectric conversion apparatus of this embodiment is the same as that in the first or second embodiment.

In the photoelectric conversion apparatus of this embodiment, a photoelectric conversion element unit, a TFT unit, and a matrix wiring unit are formed on a single substrate. The matrix wiring unit has a multilayered structure of a first conductive layer, a first insulating layer, a second conductive layer, a second insulating layer, a semiconductor layer, and a third conductive layer which are sequentially stacked on the substrate. The second conductive layer is formed by the same layer as a gate electrode of the TFT unit, the second insulating layer is formed by the same layer as a gate insulating film of the TFT unit, the semiconductor layer is formed by the same layer as a photoconductive semiconductor layer of the photoelectric conversion element unit and a semiconductor layer of the TFT unit, and the third conductive layer is formed by the same layer as a source/drain electrode of the TFT unit.

In FIG. 11, photoelectric conversion elements E1 to E12 are divided into blocks each including three elements. Two blocks constitute one group. For example, the photoelectric conversion elements E1 to E3 belong to a first block, the photoelectric conversion elements E4 to E6 belong to a second block, and, hence, the photoelectric conversion elements El to E6 belong to a first group.

The same applies to photocurrent accumulation capacitors C1 to C12, discharging TFTs DT1 to DT12, and transfer TFTs T1 to T12, which are connected in correspondence with the photoelectric conversion elements E1 to E12.

One electrode (common electrode) of each of the photoelectric conversion elements El to E12 is connected to a power source 411, and is applied with a constant voltage.

The other electrode (individual electrode) of each of the photoelectric conversion elements El to E12 is connected to one major electrode of a corresponding one of the transfer TFTs T1 to T12, is grounded through a corresponding one of the capacitors C1 to C12, and is grounded through a corresponding one of the discharging TFTs DT1 to DT12.

The gate electrodes of the discharging TFTs DT1 to DT12 are commonly connected in units of three TFTs, i.e., in units of blocks. Each block is connected to a corresponding one of parallel output terminals S13 to S16 of a shift register 410. Since high-level signals are sequentially output from the parallel output terminals at predetermined timings, the discharging TFTs DT1 to DT12 are sequentially enabled in units of blocks.

The gate electrodes of the transfer TFTs T1 to T12 are also commonly connected in units of blocks. Each block is connected to a corresponding one of parallel output terminals S1 to S4 of a shift register 401.

The other major electrode of each of the transfer TFTs T1 to T12 is connected to a corresponding one of common signal wirings 402 to 407 through a corresponding one of individual signal wirings 301 to 312. In this case, the major electrodes of the TFTs having the same number of order in the corresponding groups are commonly connected to one common signal wiring. For example, the second transfer TFTs T2 and T8 in the corresponding groups are connected to the common signal line 403 respectively through the individual signal wirings 302 and 308.

The common signal wirings 402 to 407 are connected to an input terminal of an amplifier 412 respectively through switching transistors ST1 to ST6.

The gate electrode of each of the switching transistors ST1 to ST3 and ST4 to ST6 is connected to a corresponding one of parallel output terminals S5 to S10 of shift registers 408 and 409. When high-level signals are output from these parallel output terminals, the switching transistors ST1 to ST6 are sequentially enabled.

The common signal wirings 402 to 407 are grounded through transfer charge accumulation capacitors CC1 to CC6, and are also grounded through discharging switching transistors CT1 to CT6.

The capacitances of the capacitors CC1 to CC8 are set to be sufficiently larger than those of the capacitors C1 to C12.

The gate electrodes of the switching transistors CT1 to CT6 are commonly connected in units of three transistors, and are connected to terminals S11 and S12, respectively. Therefore, when a high-level signal is applied to the terminal S11 or S12, the switching transistors CT1 to CT3 or CT4 to CT6 are enabled, and the common signal wirings 402 to 404 or 405 to 407 are grounded to remove residual charges.

The operation of this embodiment with the above-mentioned structure will be described below with reference to the timing charts shown in FIGS. 12(a) to 12(p).

When light becomes incident on the photoelectric conversion elements E1 to E12, electrical charges are accumulated in the capacitors C1 to C12 from the power source 411 according to its intensity.

Figure 12:
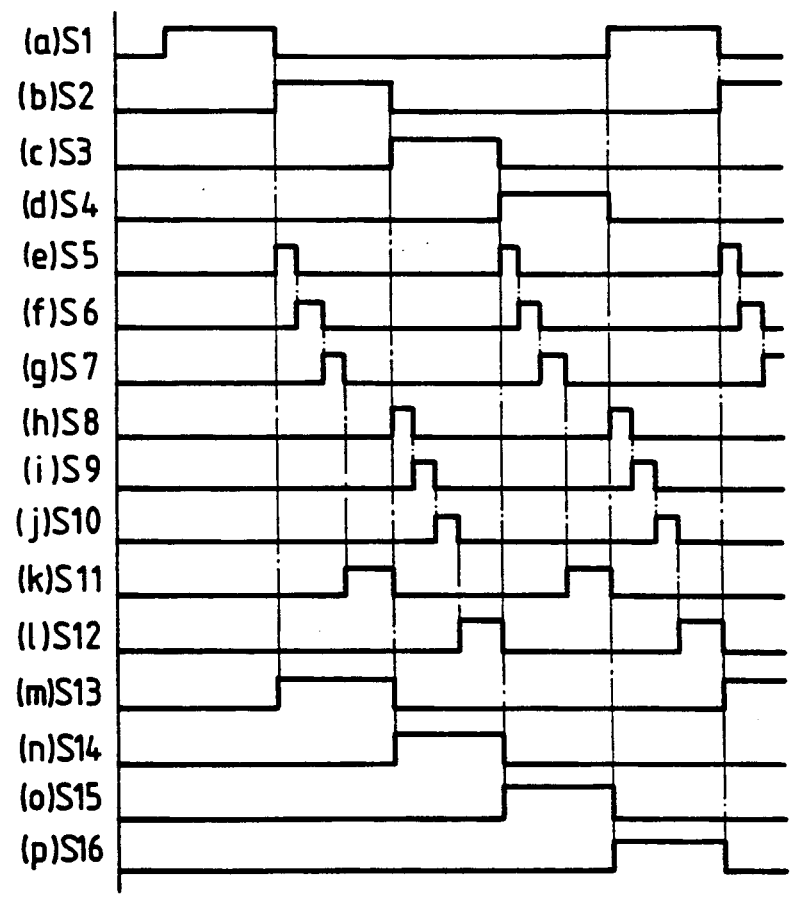
FIG. 12 is the timing chart of an example of a photoelectric conversion apparatus.

A high-level signal is output from the parallel output terminal S1 of the shift register 401 to enable the transfer TFTs T1 to T3 [FIG. 12(a)].

When the transfer TFTs T1 to T3 are enabled, the charges accumulated in the capacitors C1 to C3 of the first block are transferred to the load capacitors CC1 to CC3, respectively.

When information of the first block is transferred, a high-level signal is output from the output terminal S2 of the shift register 401 to enable the transfer TFTs T4 to T6 [FIG. 12(b)].

Thus, the charges accumulated in the capacitors C4 to C6 of the second block are respectively transferred to the load capacitors CC4 to CC6.

In parallel with the transfer operation of the second block, high-level signals are sequentially output from the output terminals S5 to S7 of the shift register 408 [FIGS. 12(e) to 12(g)].

The switching transistors ST1 to ST3 are sequentially enabled, and light information of the first block accumulated in the capacitors CC1 to CC3 is time-serially read out through the amplifier 412.

When the information of the first block is read out, a high-level signal is applied to the terminal S11 to simultaneously enable the switching transistors CT1 to CT3 [FIG. 12(k)].

The residual charges in the transfer charge accumulation capacitors CC1 to CC3 are completely discharged.

In parallel with the above-mentioned read and transfer charge discharging operations [FIGS. 12(e) to 12(g) and 12(k)], a high-level signal is output from the parallel output terminal S13 of the shift register 410 [FIG. 12(m)].

The discharging TFTs DT1 to DT3 are then enabled, and the residual charges in the light charge accumulation capacitors C1 to C3 of the first block are completely discharged.

In this manner, the information transfer operation for the second block, and the information read operation, the discharging operation of the residual transfer charges, and the discharging operation of the residual photocurrent charges for the first block are executed parallel to each other.

Upon completion of these operations, the shift register 401 is shifted, and a high-level signal is output from the parallel output terminal S3 [FIG. 12(c)].

The transfer TFTs T7 to T9 are enabled, and charges accumulated in the capacitors C7 to C9 of the third block are transferred to the capacitors CC1 to CC3.

In parallel with the information transfer operation for the third block, high-level signals are sequentially output from the parallel output terminals S8 to S10 of the shift register 409 [FIGS. 12(h) to 12(j)].

Thus, the switching transistors ST4 to ST6 are sequentially enabled, and information of the second block transferred to and accumulated in the capacitors CC4 to CC6 is time-serially read out.

When the information of the second block is read out, a high-level signal is applied to the terminal S12 to simultaneously enable the switching transistors CT4 to CT6 [FIG. 12(l)].

The residual charges in the transfer charge accumulation capacitors CC4 to CC6 are completely discharged.

In parallel with the information read operation and the residual transfer charge discharging operation for the second block, a high-level signal is output from the parallel output terminal S14 of the shift register 410 [FIG. 12(n)], thus simultaneously enabling the switching transistors ST4 to ST6.

In this manner, the residual charges in the light charge accumulation capacitors C4 to C6 are discharged.

Similarly, in parallel with the information transfer operation for the fourth block, the information read operation, the residual transfer charge discharging operation, and the residual photocurrent charge discharging operation for the third block are executed. The information read operation, the residual transfer charge discharging operation, and the residual photocurrent charge discharging operation for the fourth block are executed parallel to the information transfer operation of the first block.

The above-mentioned operations are repeated, so that light information is time-serially read out.

In this manner, in parallel with the information transfer operation of the next block, the information read operation, the residual transfer charge discharging operation, and the residual photocurrent charge discharging operation for the previous block are executed. According to this embodiment, shield wirings for keeping a constant potential are formed between adjacent signal wirings of the matrix signal wirings, so that adjacent signal wirings can be prevented from being capacitively coupled to each other. Thus, good read access free from crosstalk among output signals can be achieved at high speed.

FOURTH EMBODIMENT

Figure 13:
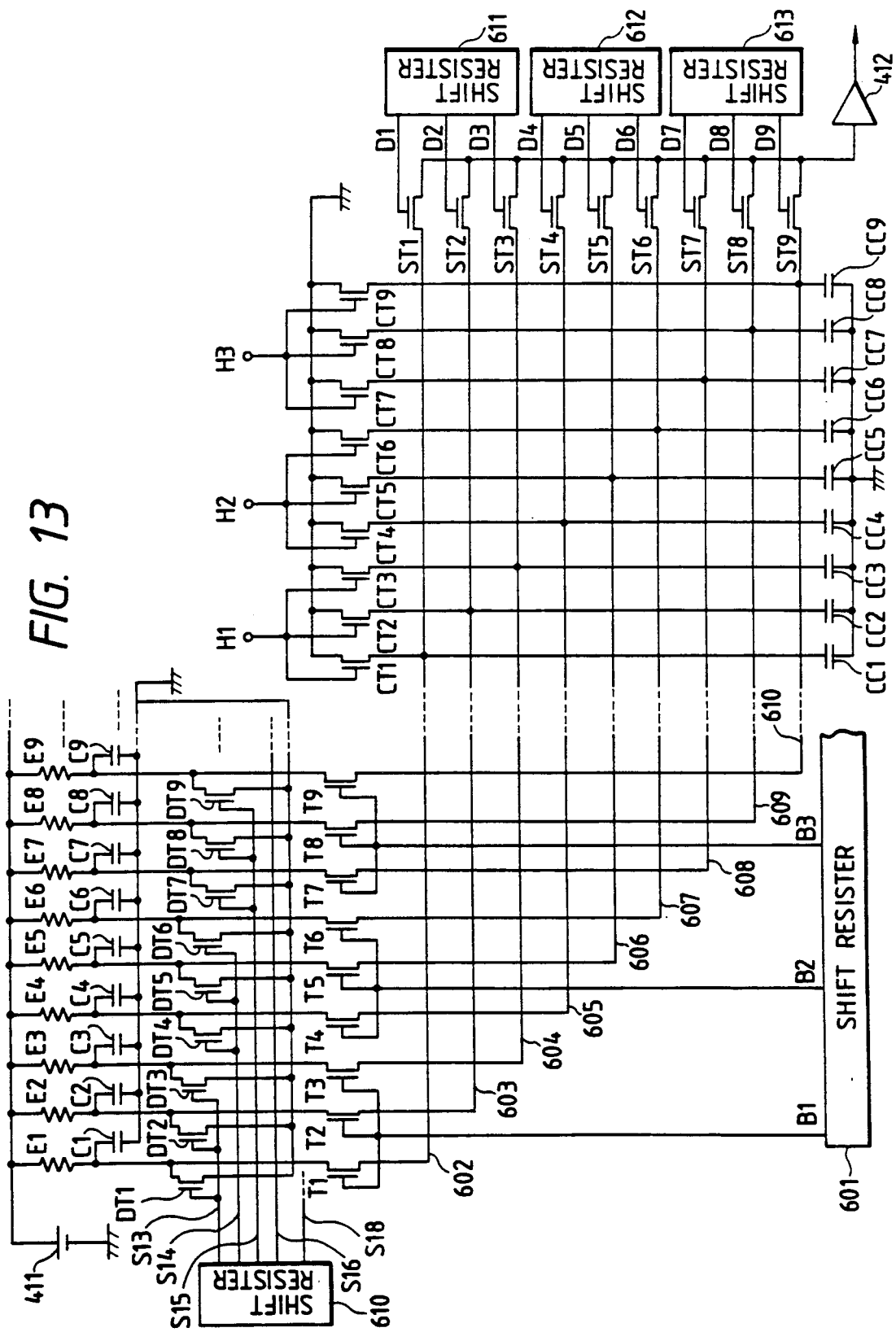
FIG. 13 is an equivalent circuit diagram of the fourth embodiment of a photoelectric conversion apparatus according to the present invention.

FIG. 13 is an equivalent circuit diagram of the fourth embodiment of a photoelectric conversion apparatus according to the present invention.

The sectional structure of the photoelectric conversion apparatus of this embodiment is the same as that in the first or second embodiment.

In the photoelectric conversion apparatus of this embodiment, a photoelectric conversion element unit, a TFT unit, and a matrix wiring unit are formed on a single substrate. The matrix wiring unit has a multilayered structure of a first conductive layer, a first insulating layer, a second conductive layer, a second insulating layer, a semiconductor layer, and a third conductive layer which are sequentially stacked on the substrate. The second conductive layer is formed by the same layer as a gate electrode of the TFT unit, the second insulating layer is formed by the same layer as a gate insulating film of the TFT unit, the semiconductor layer is formed by the same layer as a photoconductive semiconductor layer of the photoelectric conversion element unit and a semiconductor layer of the TFT unit, and the third conductive layer is formed by the same layer as a source/drain electrode of the TFT unit.

The arrangements of photoelectric conversion elements E1 to E18, light charge accumulation capacitors C1 to C18, and transfer TFTs T1 to T18 are substantially the same as those in FIG. 11, and the number of these elements is merely increased from 12 to 18. Thus, a detailed description of these elements will be omitted. In FIG. 13, a circuit is partially omitted for the sake of simplicity.

In this embodiment, three blocks form one group. The major electrodes of the transfer TFTs having the same numbers of orders in the corresponding groups are connected to corresponding common signal wirings 402 to 410.

The gate electrodes of the transfer TFTs T1 to T18 are commonly connected in units of blocks, and are connected to corresponding parallel output terminals B1 to B6 of a shift register 601.

Similarly, the gate electrodes of discharging TFTs DT1 to DT18 are also connected to corresponding parallel output terminals S13 to S18 of a shift register 610.

The common signal wirings 602 to 610 are grounded through transfer charge accumulation capacitors CC1 to CC9, and are also grounded through discharging TFTs CT1 to CT9.

The gate electrodes of the discharging TFTs CT1 to CT9 are commonly connected in units of three TFTs, and are connected to corresponding terminals H1 to H3.

The common signal wirings 602 to 610 are connected to an amplifier 412 through switching transistors ST1 to ST9, and the gate electrodes of the switching transistors ST1 to ST9 are connected to corresponding parallel output terminals D1 to D9 of shift registers 611 to 613.

The operation of this embodiment with the above-mentioned arrangement will be described below with reference to the timing charts shown in FIGS. 14(a) to 14(x).

Figure 14:
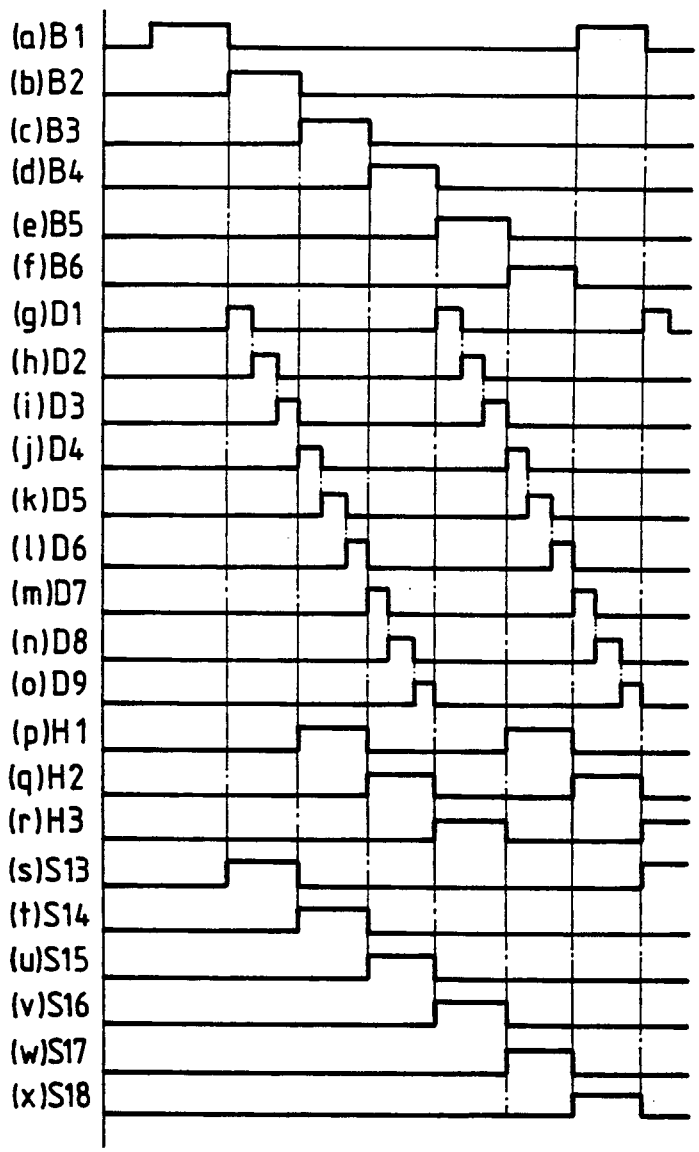
FIG. 14 is the timing chart of an example of a photoelectric conversion apparatus.

A high-level signal is output from the output terminal B1 of the shift register 601 to enable the transfer TFTs T1 to T3 [FIG. 14(a)].

When the transfer TFTs T1 to T3 are enabled, charges accumulated in the capacitors C1 to C3 of the first block are respectively transferred to the capacitors CC1 to CC3.

When information of the first block is transferred, a high-level signal is output from the output terminal B2 of the shift register 601 to enable the transfer TFTs T4 to T6 [FIG. 14(b)]. Thus, charges accumulated in the capacitors C4 to C6 of the second block are respectively transferred to the capacitors CC4 to CC6.

In parallel with the transfer operation for the second block, high-level signals are sequentially output from the output terminals D1 to D3 of the shift register 611 [FIGS. 14(g) to 14(i)].

Thus, the switching transistors ST1 to ST3 are sequentially enabled, and light information of the first block transferred to and accumulated in the capacitors CC1 to CC3 is time-serially read out through an amplifier 412.

In parallel with the transfer operation for the second block, a high-level signal is output from the terminal S13 of the shift register 610 [FIG. 14(s)] to enable the discharging TFTs DT1 to DT3. As a result, residual light charges in the capacitors C1 to C3 of the first block are discharged.

Upon completion of the information read operation and the residual light charge discharging operation for the first block, a high-level signal is applied to the terminal H1 to simultaneously enable the switching transistors CT1 to CT3 [FIG. 14(p)]. Thus, residual charges in the capacitors CC1 to CC3 are completely discharged.

In parallel with this discharging operation, a high-level signal is output from the output terminal B3 of the shift register 601 [FIG. 14(c)].

In this manner, the transfer TFTs T7 to T9 are enabled, and charges accumulated in the capacitors C7 to C9 of the third block are respectively transferred to the capacitors CC6 to CC9.

In parallel with the discharging and transfer operations, high-level signals are sequentially output from output terminals D4 to D6 of a shift register 612 [FIGS. 14(j) to 14(l)], thus sequentially enabling the switching transistors ST4 to ST6. As a result, information of the second block is time-serially read out.

Furthermore, in parallel with the discharging and transfer operations, a high-level signal is output from the output terminal S14 of the shift register 610 [FIG. 14(t)], thereby discharging residual light charges from the capacitors C4 to C6 of the second block.

Subsequently, the transfer operation of information of the fourth block [FIG. 14(d)], time-serial read operation of information of the third block [FIGS. 14(s) to 14(o)], the discharging operation of residual transfer charges in the capacitors CC4 to CC6 [FIG. 14(q)], and the discharging operation of residual light charges in the capacitors C7 to C9 [FIG. 14(u)] are performed parallel to each other, so that light information of the photoelectric conversion elements E1 to E18 is similarly repetitively read.

In this manner, according to this embodiment, since one group is formed by three blocks, the transfer operation of information of a given block, the read and residual light charge discharging operations of an immediately preceding block, and the residual transfer charge discharging operation of a block preceding the immediately preceding block can be parallelly executed, and a high-speed operation as a whole can be realized.

Shield wirings for keeping a constant potential are formed between adjacent signal wirings of the matrix signal wirings, so that adjacent signal wirings can be prevented from being capacitively coupled to each other. Thus, good read access free from crosstalk among output signals can be achieved.

FIFTH EMBODIMENT

Figure 15:
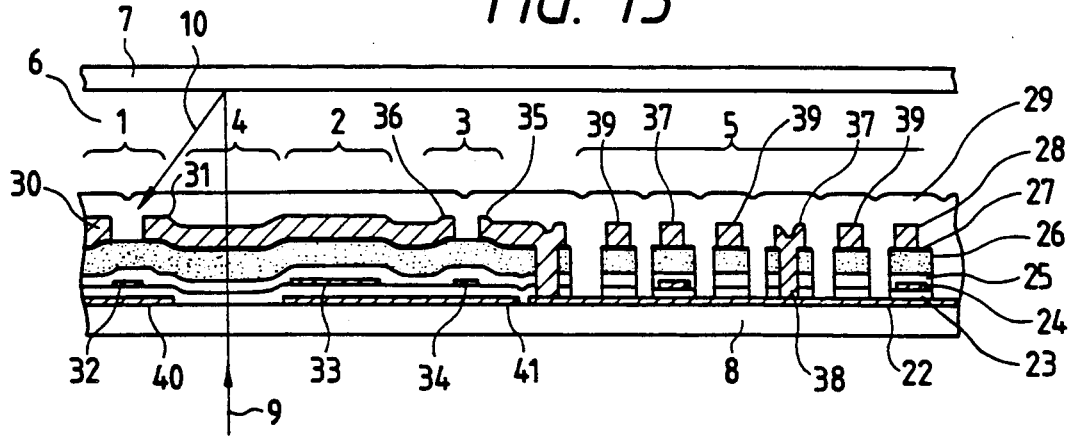
FIG. 15 is a cross-sectional view of the fifth embodiment of a photoelectric conversion apparatus according to the present invention.

FIG. 15 is a sectional view of the fifth embodiment of a photoelectric conversion apparatus according to the present invention. The same reference numerals as in the above embodiments denote the same parts in this embodiment.

The characteristic feature of this embodiment is that light-shielding layers 40 and 41 are formed on the substrate in a photoelectric conversion element unit 1 and a TFT unit 3 to sandwich an insulating layer 23 with layers 32, 33, and 34.

The light-shielding layers 40 and 41 can prevent that illumination light 9 is radiated directly or indirectly as stray light on a semiconductor layer 26 of the photoelectric conversion element unit 1 or the TFT unit 3 to disturb photoelectric conversion or switching characteristics.

A detailed application of the embodiment of the photoelectric conversion apparatus of the present invention will be explained below.

Figure 16:
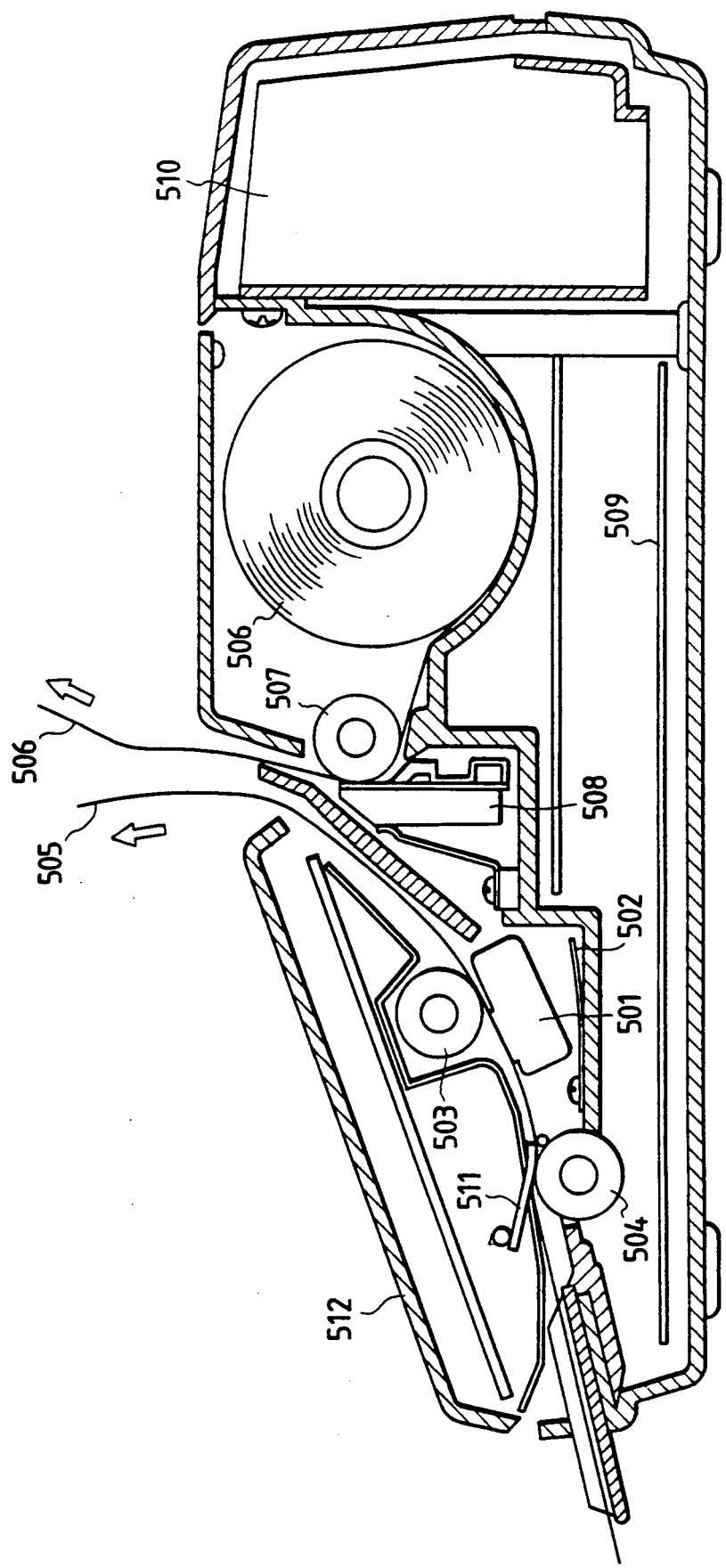
FIG. 16 is a schematic sectional view of a facsimile apparatus using the embodiment of the present invention.

FIG. 16 is a schematic sectional view of a facsimile apparatus using the embodiment of the present invention.

In FIG. 16, in an original transmission mode, an original 505 is urged against a lens type proximity image sensor 501 by a platen roller 503, and is moved in a direction of an arrow by the platen roller 503 and a feed roller 504. An original surface is illuminated by a xenon lamp 502 as a light source, and light reflected by the original surface becomes incident on the sensor 501 corresponding to the photoelectric conversion apparatus of this embodiment. The reflected light is converted by the sensor 501 into an electrical signal corresponding to image information on the original, and the electrical signal is transmitted.

In a reception mode, a recording sheet 506 is conveyed by a recording platen roller 507, and an image corresponding to a reception signal is reproduced by a thermal head 508.

The entire apparatus is controlled by a controller on a system control board 509, and respective drive systems and circuits are powered by a power source 510. Reference numerals 511 and 512 respectively designate a peeling piece and an operation panel.

As described above, according to a semiconductor device and a photoelectric conversion apparatus using the same of the embodiment of the present invention, there can be provided a semiconductor device and a photoelectric conversion apparatus which are free from crosstalk among output signals of matrix wirings, and have matrix wirings which are formed in a simple manufacturing process and have a low error rate since a matrix wiring unit is formed to have a multilayered structure of at least a first conductive layer, a first insulating layer, a second conductive layer, a second insulating layer, a semiconductor layer, and a third conductive layer in the order named.

SIXTH EMBODIMENT

The present invention will be described below with reference to the accompanying drawings.

A semiconductor device of the present invention is not always limited to a photoelectric conversion apparatus. In this case, the photoelectric conversion apparatus will be exemplified below as a preferred embodiment.

Figure 17:
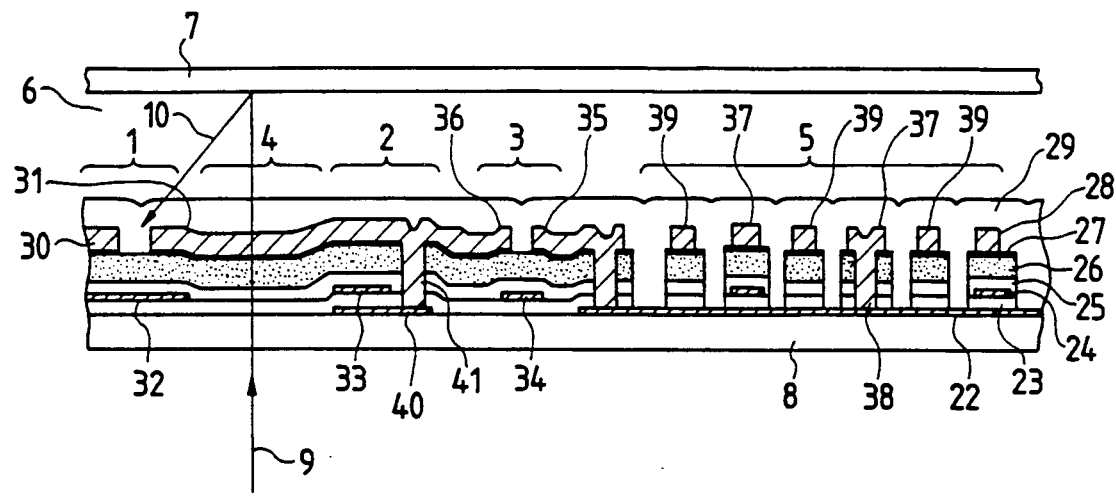
FIG. 17 is a cross-sectional view of the sixth embodiment of a photoelectric conversion apparatus of the present invention.

FIG. 17 is a sectional view of the sixth embodiment of a photoelectric conversion apparatus of the present invention.

In the photoelectric conversion apparatus of this embodiment, a photoelectric conversion unit, an accumulation capacitor unit, a TFT unit, a matrix wiring unit, and the like are integrally formed on an insulating substrate in the same process using a-Si:H of an amorphous material as a semiconductor layer. The same reference numerals in FIG. 17 denote the same parts as in FIG. 3.

The structure shown in FIG. 17 includes a photoelectric conversion element unit 1, an accumulation capacitor unit 2, a TFT unit 3, a portion 4 having an illumination window (not shown) of incident light, a matrix wiring unit 5, a transparent spacer 6, an original 7, and a substrate 8. Incident light indicated by an arrow 9 reaches the photoelectric conversion element unit 1 as reflected light 10 (i.e., information light) through the original 7.

The information light incident on the photoelectric conversion element unit 1 is converted to a photocurrent, and is accumulated in the accumulation capacitor unit 2 as charges. After the lapse of a predetermined period of time, charges accumulated in the accumulation capacitor unit 2 are transferred by the TFT unit 3 toward the matrix wiring unit 5.

On the substrate 8, a first conductive layer 22 of Al, Cr, or the like, a first insulating layer 23 of, e.g., SiN, a second conductive layer 24 of Al, Cr, or the like, a second insulating layer 25 of, e.g., SiN, a semiconductor layer 26 of a-Si:H, a heavily doped n+-type a-Si:H ohmic contact layer 27, a third conductive layer 28 of Al, Cr, or the like, and a protective layer 29 of, e.g., polyimide are formed.

The photoelectric conversion element unit 1 includes upper electrode wiring layers 30 and 31. The light 10 reflected by an original surface causes a conductivity of the a-Si:H photoconductive semiconductor 26 to change, thereby changing a current flowing between the interdigitally opposing upper electrode wiring layers 30 and 31. Note that reference numeral 32 designates a metal light-shielding layer. The layer 32 may be connected to an appropriate drive source to serve as a gate electrode as a control electrode for the main electrodes 30 (source side) and 31 (drain side).

The accumulation capacitor unit 2 is constituted by a first electrode wiring layer 40, a dielectric formed of a first insulating layer 23 formed on the first electrode wiring layer 40, a second electrode wiring layer 33 formed on the first insulating layer 23, a dielectric formed of a second insulating layer 25 formed on the second electrode wiring layer 22 and of a photoconductive semiconductor layer 26, and a third electrode wiring layer formed on the photoconductive semiconductor layer 26 and contiguous with the upper electrode wiring layer 31 of the photoelectric conversion element unit. The first and third electrode wiring layers 40 and 31 are in ohmic contact with each other through a contact hole 41. The accumulation capacitor unit 2 has a so-called two-storied capacitor structure, and can increase an accumulation capacity without increasing a substrate size. Either positive or negative bias conditions may be used. The unit 2 is used while the second electrode wiring layer 33 is kept negatively biased, thus obtaining a stable capacitance and frequency characteristics.

The TFT unit 3 comprises a lower electrode wiring layer 34 serving as a gate electrode, the second insulating layer 25 constituting a gate insulating layer, the semiconductor layer 26, an upper electrode wiring layer 35 serving as a source electrode, an upper electrode wiring layer 36 serving as a drain electrode, and the like.

In the matrix wiring unit 5, individual signal wirings each formed of the first conductive layer 22, the first insulating layer 23 covering the individual signal wiring layer, the second conductive layer 24 for keeping a constant potential, the second insulating layer 25 formed on the second conductive layer, the semiconductor layer 26, the ohmic contact layer 27, and common signal wirings 37 which cross the individual signal wirings and are formed of the third conductive layer are sequentially stacked on the substrate 8. Reference numeral 38 designates a contact hole for forming an ohmic contact between the individual wirings 22 and the common signal wirings 37. Reference numeral 39 designates interline shielding wirings which are formed between adjacent common signal wirings.

As described above, in the photoelectric conversion apparatus of this embodiment, all the constituting units, i.e., the photoelectric conversion element unit, the accumulation capacitor unit, the TFT unit, and the matrix wiring unit have the multilayered structure of the photoconductive semiconductor, the insulating layers, the conductive layers, and the like, and these units can be simultaneously formed in the same process.

The second conductive layer which can keep a constant potential is formed at the intersection between the output individual and common signal wirings, thereby eliminating a stray capacitance formed at the intersection between the individual and common signal wirings. Furthermore, the shielding wirings which can keep a constant potential are formed between the adjacent common signal wirings and on two sides of each common signal wiring, thus preventing formation of a capacitance between adjacent common signal wirings.

Note that the shielding wirings which can keep a constant potential may be formed between the adjacent common signal wirings, so that formation of a capacitance between adjacent individual signal wirings can also be prevented.

FIGS. 18A to 18H are sectional views showing steps in the manufacture of the embodiment shown in FIG. 17. The step in the manufacture of this embodiment will be described below with reference to FIGS. 18A to 18H.

Figure 18A:
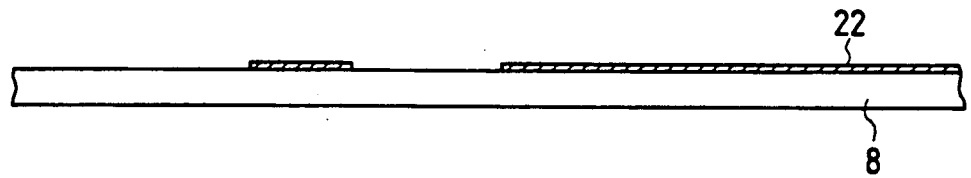
FIGS. 18A to 18H are sectional views showing steps in the manufacture of the embodiment shown in FIG. 17.

As shown in FIG. 18A, a 0.1-$\mu$m thick first conductive layer 22 of Al, Cr, or the like was deposited on a transparent substrate 8 of, e.g., glass by sputtering or deposition, and was patterned into a desired shape.

Figure 18B:
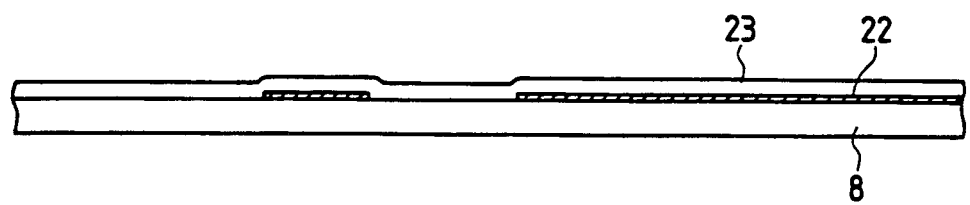

As shown in FIG. 18B, a 0.3-$\mu$m thick first insulating layer 23 of silicon nitride (SiN) was formed on the structure shown in FIG. 18A by a known technique such as plasma CVD.

Figure 18C:
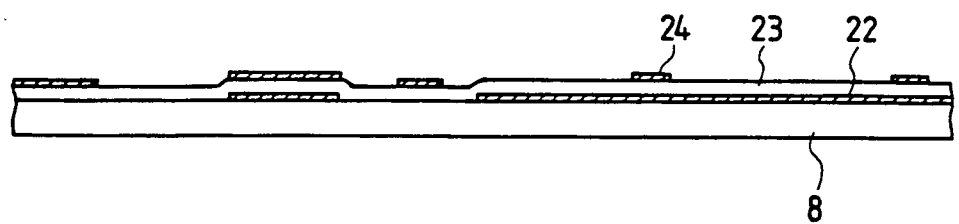

As shown in FIG. 18C, a 0.1-$\mu$m thick second conductive layer 24 of Al, Cr, or the like was deposited by sputtering or deposition, and was patterned to a desired shape.

Figure 18D:
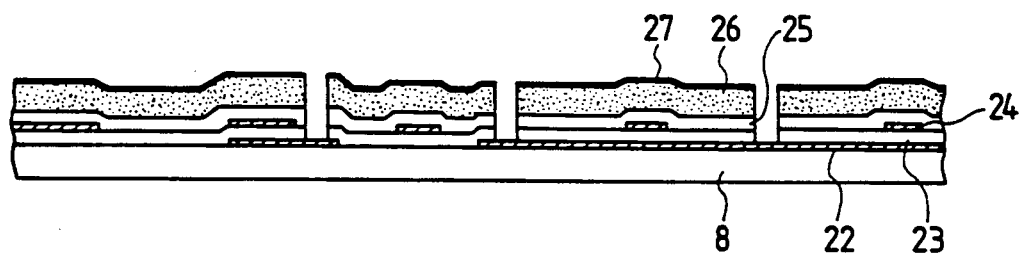

As shown in FIG. 18D, a 0.3-$\mu$m thick second insulating layer 25 of SiN, a 0.6-$\mu$m thick a-Si:H layer 26, and a 0.15-$\mu$m thick n$^+$-type a-Si:H doping layer 27 were formed by a known technique, e.g., plasma CVD, and these three layers 25, 26, and 27 were patterned to form contact holes.

Figure 18E:
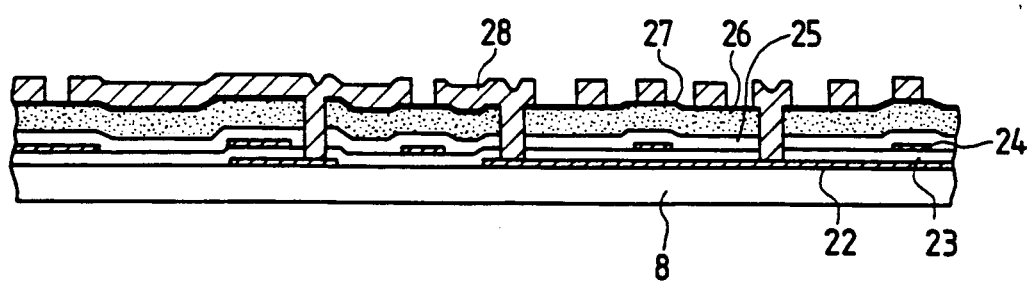

As shown in FIG. 18E, a third conductive layer 28 of Al, Cr, or the like was formed by sputtering or deposition, and was patterned into a desired shape.

Figure 18F:
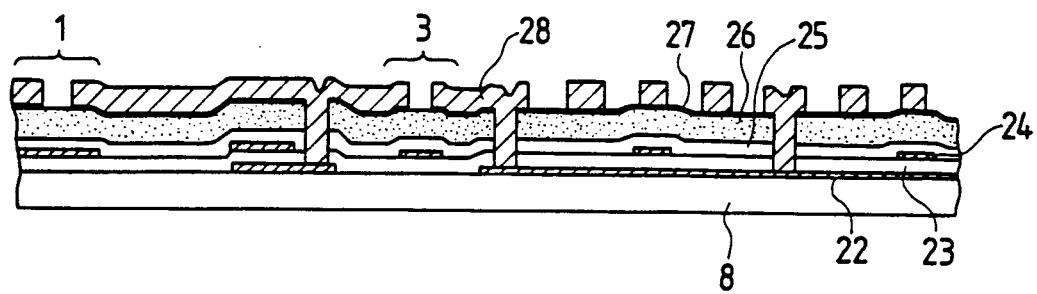
Figure 18G:
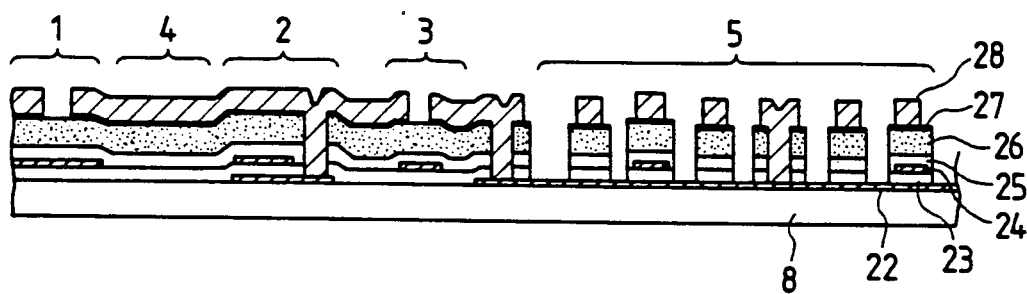

As shown in FIG. 18F, the n'-type a Si:H doping layers on the gap portion of the photoelectric conversion unit 1 and the channel portion of the TFT unit 3 were removed by etching. As shown in FIG. 18G, an unnecessary semiconductor layer was removed to achieve element isolation in units of bits.

Figure 18H:
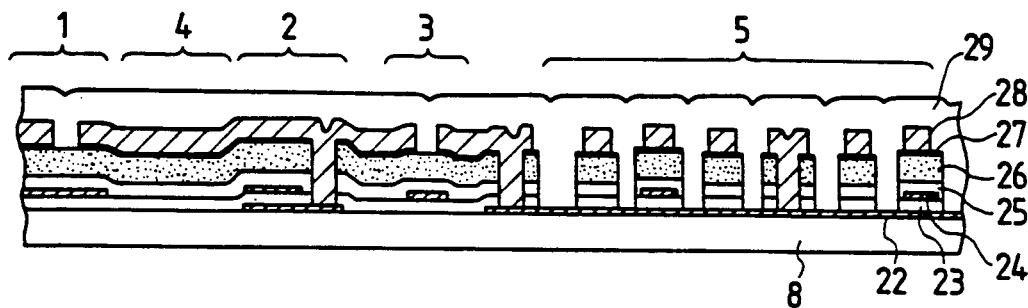

Thereafter, as shown in FIG. 18H, a third insulating layer 29 of a polyimide film or an SiN film as a protective layer was formed on the third conductive layer 28.

As described above, in a photoelectric conversion apparatus of this embodiment including the photoelectric conversion element unit, the accumulation capacitor unit, the TFT unit, and the matrix wiring unit which are formed on the single substrate, the accumulation capacitor unit and the matrix wiring unit have a multilayered structure including the first conductive layer, the first insulating layer, the second conductive layer, the semiconductor layer, the third conductive layer which are sequentially stacked on the substrate. In this structure, the second conductive layer is formed by the same layer as a gate electrode of the TFT unit, the second insulating layer is formed by the same layer as a gate insulating film of the TFT unit, the semiconductor layer is formed by the same layer as the photoconductive semiconductor layer of the photoelectric conversion element unit and the semiconductor layer of the TFT unit, and the third conductive layer is formed by the same layer as a source/drain electrode of the TFT unit.

Therefore, the accumulation capacitor unit can be parallel connections of a two-storied structure, and the capacity of the accumulation capacitor can be increased without increasing the substrate size of the photoelectric conversion apparatus. As a result, a photoelectric conversion apparatus which is not influenced by a noise component such as a stray capacitance formed between the conductive layer for holding a constant potential and the signal wirings can be realized.

The reading circuit of the photoelectric conversion apparatus of this embodiment is the same as that shown in FIG. 9, and its operation is also the same.

Figure 6A:
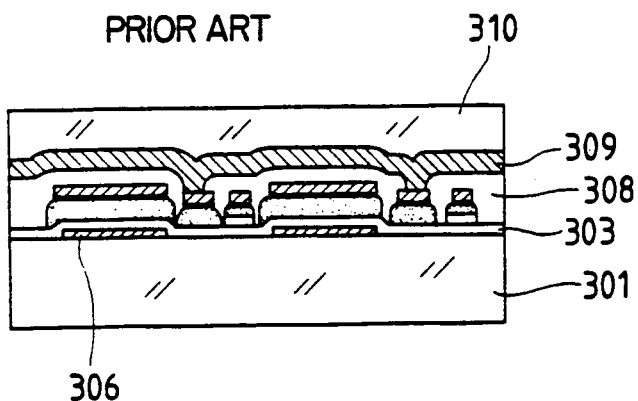
FIG. 6A is a cross-sectional view taken along a line A-A' in FIG. 5.
Figure 6B:
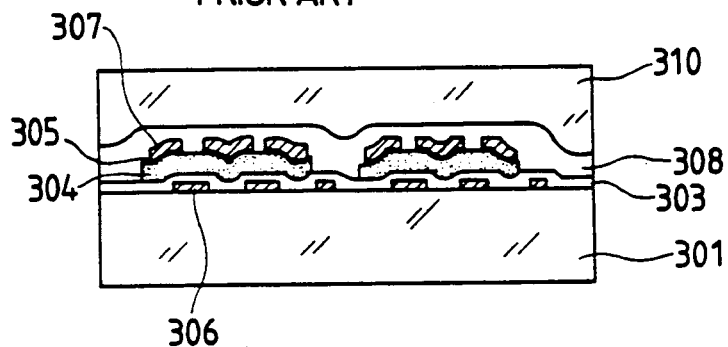
FIG. 6B is a cross-sectional view taken along a line B-B' in FIG. 5.
Figure 6C:
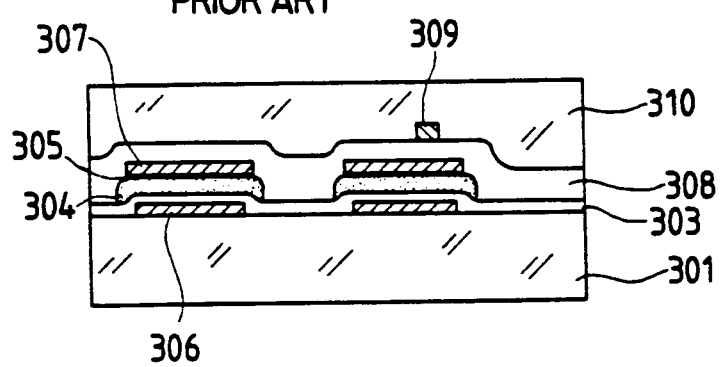
FIG. 6C is a cross-sectional view taken along a line C-C' in FIG. 5.

A detailed application of the embodiment of the photoelectric conversion apparatus of this embodiment is also the same as that shown in FIG. 6, and a description thereof will be omitted.

In the semiconductor device and the photoelectric conversion apparatus using the same according to the embodiment described above, a matrix wiring and a charge accumulation means are formed to have a multilayered structure of at least a first conductive layer, a first insulating layer, a second conductive layer, a second insulating layer, a semiconductor layer, and a third conductive layer in the order named, and the layers of the matrix wiring and the corresponding layers of the charge accumulation means are formed by the same layers. Therefore, there can be provided a semiconductor device and a photoelectric conversion apparatus which are free from crosstalk among output signals of matrix wirings, and have matrix wirings which are formed in a simple manufacturing process and have a low error rate. In addition, the capacitance of the charge accumulation means can be increased without increasing a substrate size, and the charge accumulation means can be formed in a simple process. As a result, there can be provided a semiconductor device and a photoelectric conversion apparatus which can improve an S/N ratio, a dynamic range, and the like, can obtain stable characteristics, and can be rendered compact.

SEVENTH EMBODIMENT

The seventh embodiment of the present invention will be described below with reference to the accompanying drawings.

A semiconductor device of the present invention is not always limited to a photoelectric conversion apparatus. In this case, the photoelectric conversion apparatus will be exemplified below as a preferred embodiment.

Figure 19A:
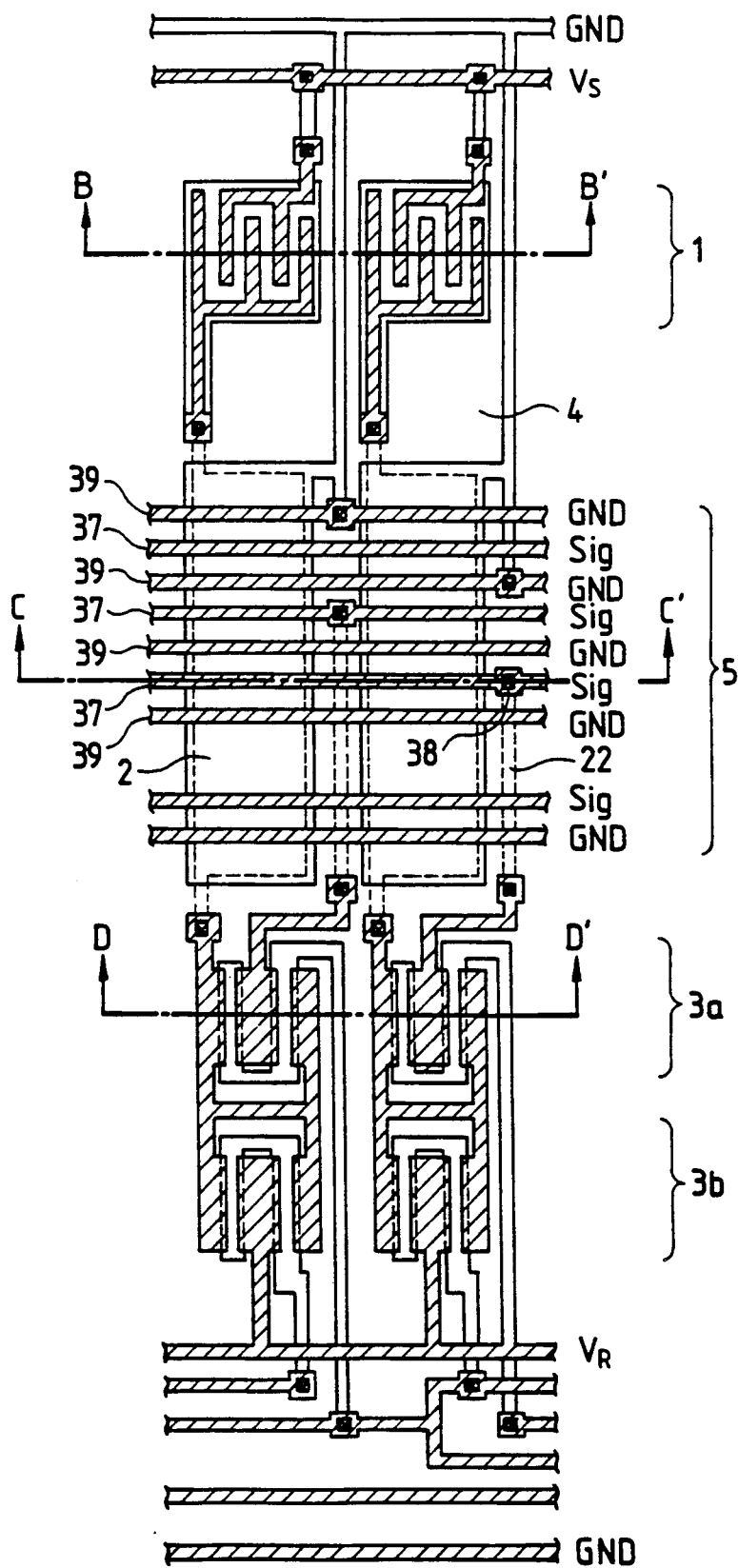
FIG. 19A is a plan view of the seventh embodiment of a photoelectric conversion apparatus of the present invention.
Figure 19B:
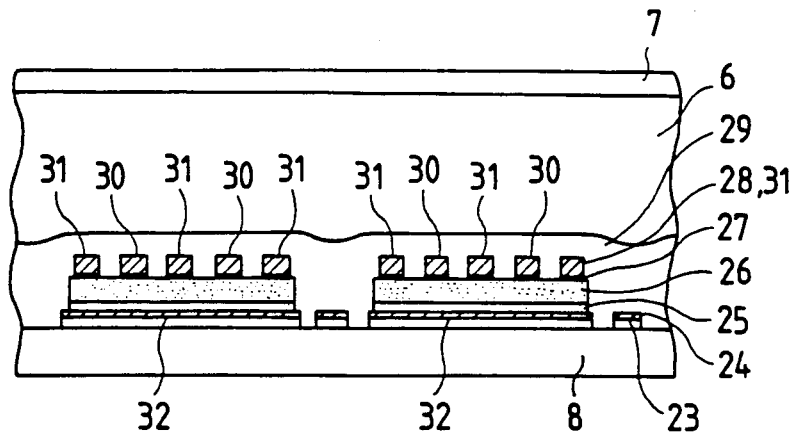
FIG. 19B is a longitudinal cross-sectional view taken along a line B-B' in FIG. 19A.
Figure 19C:
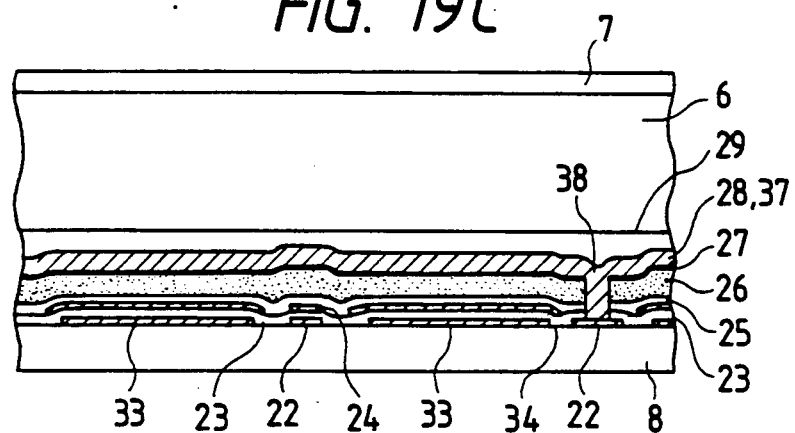
FIG. 19C is a longitudinal cross-sectional view taken along a line C-C' in FIG. 19A.
Figure 19D:
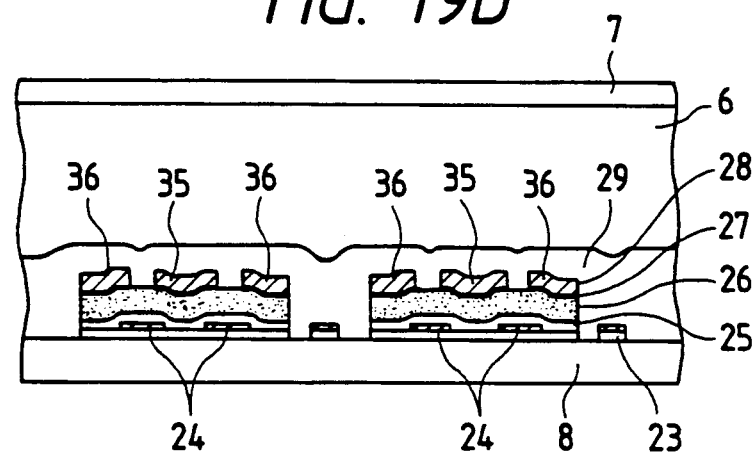
FIG. 19D is a longitudinal sectional view taken along a line D-D' in FIG. 19A.

FIG. 19A is a plan view of the seventh embodiment of a photoelectric conversion apparatus of the present invention, FIG. 19B is a longitudinal sectional view taken along a line B-B' in FIG. 19A, FIG. 19C is a longitudinal sectional view taken along a line C-C' in FIG. 19A, and FIG. 19D is a longitudinal sectional view taken along a line D-D' in FIG. 19A.

Figure 20:
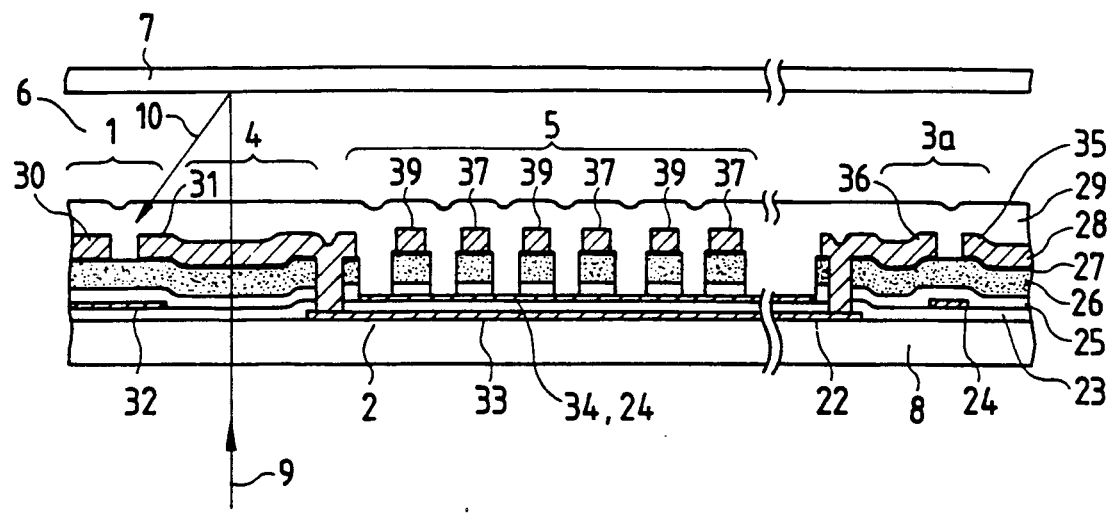
FIG. 20 is cross-sectional view for explaining the structures of respective structural units of the photoelectric conversion apparatus.

FIG. 20 is a sectional view for explaining the structures of respective structural units of the photoelectric conversion apparatus.

Note that the sectional view of the photoelectric conversion apparatus shown in FIG. 20 is used to explain the layer structures of the constituting units, and does not perfectly correspond to the constituting units of the photoelectric conversion apparatus shown in FIGS. 19A to 19D. The layer structures are the same as those shown in FIGS. 19B to 19D.

In the photoelectric conversion apparatus of the embodiment shown in FIGS. 19A to 19D and FIG. 20, a photoelectric conversion unit, an accumulation capacitor unit, a TFT unit, a matrix wiring unit, and the like are integrally formed on an insulating substrate in the same process using a-Si:H of an amorphous material as a semiconductor layer. The same reference numerals in this embodiment denote the same parts as in FIG. 3.

In FIG. 19A, a first wiring layer pattern is indicated by broken lines, a second wiring layer pattern is indicated by solid lines, and a third wiring layer pattern is indicated by hatching. The structure shown in FIG. 19A includes a matrix signal wiring unit 5, a photoelectric conversion element unit 1, an accumulation capacitor 2 formed in lower layers of the matrix signal wiring unit, a transfer TFT 3a, a reset TFT 3b, and an illumination window 4. FIG. 19B is a longitudinal sectional view of the photoelectric conversion element unit, FIG. 19C is a longitudinal sectional view of the matrix signal wiring unit and the accumulation capacitor, and FIG. 19D is a longitudinal sectional view of the transfer TFT unit.

The structure shown in FIG. 20 includes a transparent spacer 6, an original 7, and a substrate 8. Incident light indicated by an arrow 9 reaches the photoelectric conversion element unit 1 as reflected light 10 (i.e., information light) via the original 7.

The information light incident on the photoelectric conversion element unit 1 is converted to a photocurrent, and is accumulated in the accumulation capacitor 2 as charges. After the lapse of a predetermined period of time, charges accumulated in the accumulation capacitor 2 are transferred by the transfer TFT unit 3a toward the matrix wiring unit 5.

In FIGS. 19B and 19D and FIG. 20, a first conductive layer 22 of Al, Cr, or the like, a first insulating layer 23 of, e.g., SiN, a second conductive layer 24 of Al, Cr, or the like, a second insulating layer 25 of, e.g., SiN, an a-Si:H semiconductor layer 26, an n+-type a-Si:H ohmic contact layer 27, a third conductive layer 28 of Al, Cr, or the like, and a protective layer 29 of, e.g., polyimide are formed on the substrate 8.

The photoelectric conversion element unit 1 shown in FIGS. 19B and 20 includes upper electrode wiring layers 30 and 31. The light 10 reflected by an original surface causes a conductivity of the a-Si:H photoconductive semiconductor 26 to change, thereby changing a current flowing between the interdigitally opposing upper electrode wiring layers 30 and 31. Note that reference numeral 32 designates a metal light-shielding layer. The layer 32 may be connected to an appropriate drive source to serve as a gate electrode as a control electrode for main electrodes 30 (source side) and 31 (drain side).

The accumulation capacitor 2 shown in FIGS. 19C and 20 is constituted by a first electrode wiring layer 33 formed of the first conductive layer on the substrate 8, a dielectric consisting of the first insulating layer 23 on the first electrode wiring 33, and a second electrode wiring layer 34 formed by the second conductive layer 24 on the dielectric. The second electrode wiring 34 is always kept at a constant potential.

The TFT unit 3 shown in FIGS. 19D and 20 comprises the lower electrode wiring layer 34 serving as a gate electrode, the second insulating layer 25 constituting a gate insulating layer, the semiconductor layer 26, an upper electrode wiring layer 35 serving as a source electrode, an upper electrode wiring layer 36 serving as a drain electrode, and the like.

In the matrix wiring unit 5 shown in FIGS. 19C and 20, individual signal wirings 22 each formed of the first conductive layer, the first insulating layer 23 covering the individual signal wiring layer, the second conductive layer 24 for holding a constant potential, the second insulating layer 25 formed on the second conductive layer, the semiconductor layer 26, the ohmic contact layer 27, and common signal wirings 37 which cross the individual signal wirings and are formed of the third conductive layer are sequentially stacked on the substrate 8. Reference numeral 38 designates a contact hole for forming an ohmic contact between the individual wirings 22 and the common signal wirings 37. Reference numeral 39 designates interline shielding wirings which are formed between adjacent common signal wirings.

As described above, in the photoelectric conversion apparatus of this embodiment, all the constituting units, i.e., the photoelectric conversion element unit, the accumulation capacitor, the TFT unit, and the matrix wiring unit have a multilayered structure of the photoconductive semiconductor layer, the insulating layers, and the conductive layers. Therefore, these units can be simultaneously formed in the same process.

Since the second conductive layer which can keep a constant potential is formed at intersections between the output individual signal wirings and the common signal wirings, a stray capacitance formed at the intersection between the individual signal wirings and the common signal wirings is eliminated. In addition, the shield wiring which can keep a constant potential is formed between adjacent common signal wirings, thereby preventing formation of a capacitance between the common signal wirings.

Note that the shield wiring which can keep a constant potential may be formed between the individual signal wirings, so that formation of a capacitance between adjacent individual signal wirings can be prevented.

In this manner, the second electrode wiring layer for holding a constant potential of the accumulation capacitor and the shield wiring for holding a constant potential at the intersections between the matrix signal wirings are commonly formed by the second conductive layer, so that the accumulation capacitor and the matrix signal wiring unit are formed at the same portion on the substrate, thus reducing the substrate width of the photoelectric conversion apparatus.

FIGS. 21A to 21H are sectional views showing steps in the manufacture of the embodiment shown in FIG. 20. Note that the photoelectric conversion apparatus shown in FIGS. 19A to 19D is also manufactured in the same steps. The manufacturing process will be described below with reference to FIGS. 21A to 21H.

Figure 21A:
FIGS. 21A to 21H are cross-sectional views showing steps in the manufacture of the embodiment shown in FIG. 20.

As shown in FIG. 21A, 0.1-μm thick first conductive layer 22 of Al, Cr, or the like was deposited on a transparent substrate 8 of, e.g., glass by sputtering or deposition, and was patterned into a desired shape.

Figure 21B:
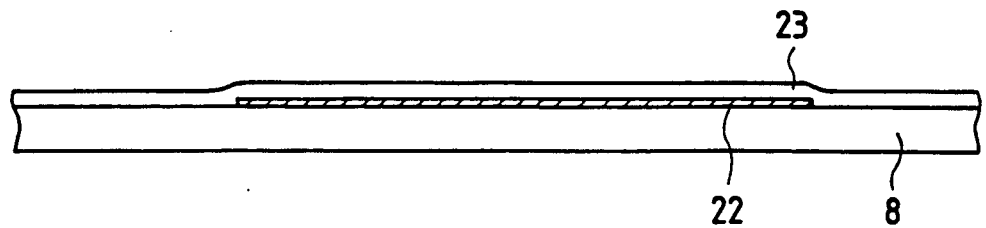

As shown in FIG. 21B, a 0.3-μm thick first insulating layer 23 of silicon nitride (SiN) was formed on the structure shown in FIG. 21A by a known technique such as plasma CVD.

Figure 21C:
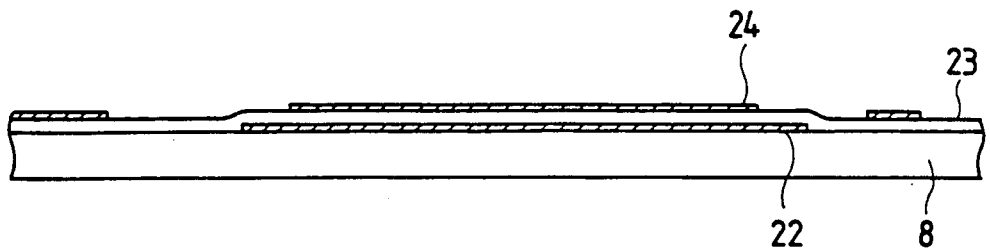

As shown in FIG. 21C, a 0.1-μm thick second conductive layer 24 of Al, Cr, or the like was deposited by sputtering or deposition, and was patterned to a desired shape.

Figure 21D:
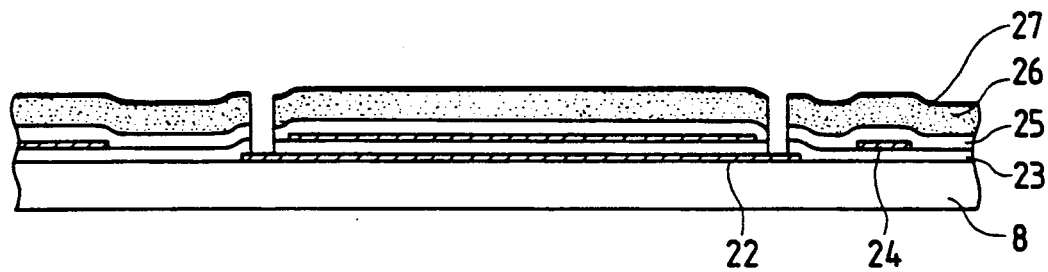

As shown in FIG. 21D, a 0.3-μm thick second insulating layer 25 of SiN, a 0.6-μm thick a-Si:H layer 26, and a 0.15-μm thick n+-type a-Si:H doping layer 27 were formed by a known technique, e.g., plasma CVD, and these three layers 25, 26, and 27 were patterned to form contact holes.

Figure 21E:
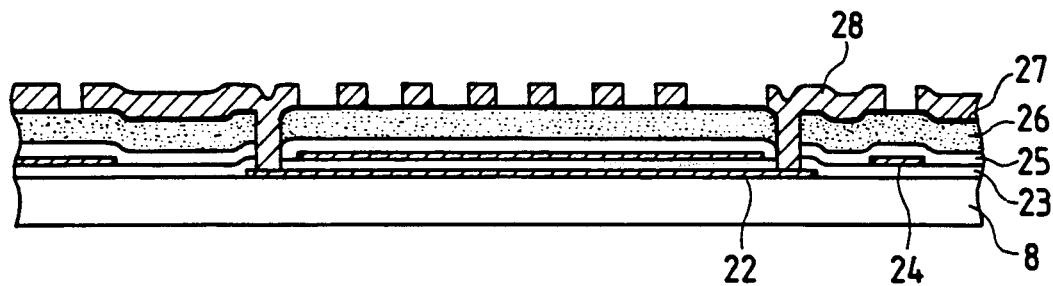

As shown in FIG. 21E, a third conductive layer 28 of Al, Cr, or the like was formed by sputtering or deposition, and was patterned into a desired shape.

Figure 21F:
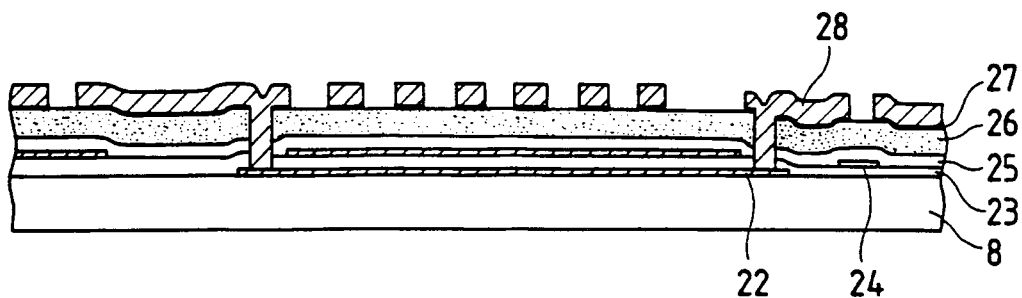
Figure 21G:
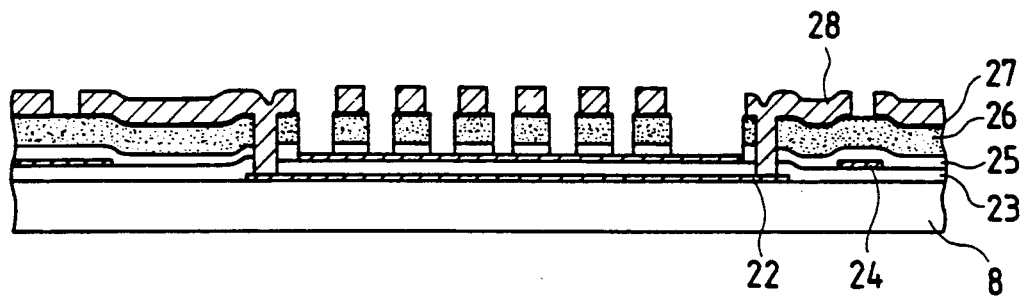

As shown in FIG. 21F, the n'-type a-Si'H doping layers on the gap portion of the photoelectric conversion unit 1 and the channel portion of the TFT unit 3 were removed by etching. As shown in FIG. 21G, an unnecessary semiconductor layer was removed to achieve element isolation in units of bits.

Figure 21H:
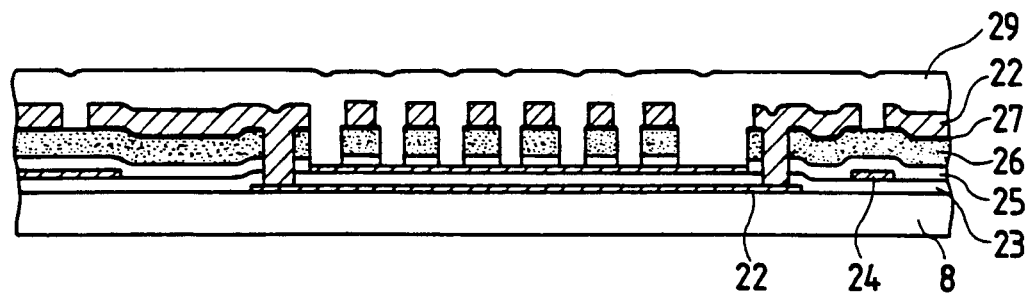

Thereafter, as shown in FIG. 21H, a third insulating layer 29 of a polyimide film or an SiN film as a protective layer was formed on the third conductive layer 28.

As described above, in the photoelectric conversion apparatus of this embodiment, in which the photoelectric conversion unit, the accumulation capacitor, the TFT unit, and the matrix wiring unit are formed on the single substrate, the matrix wiring unit is formed to have a multilayered structure of the first conductive layer, the first insulating layer, the second conductive layer, the second insulating layer, the semiconductor layer, and the third conductive layer which are sequentially stacked on the substrate. The accumulation capacitor has a structure in which the first conductive layer, the first insulating layer, and the second conductive layer are sequentially stacked at the same portions as those in the matrix signal wiring unit on the substrate. Of these layers, the second conductive layer is formed by the same layer as a gate electrode of the TFT unit, the second insulating layer is formed by the same layer as a gate insulating layer of the TFT unit, the semiconductor layer is formed by the same layer as the photoconductive semiconductor layer of the photoelectric conversion element unit and the semiconductor layer of the TFT unit, and the third conductive layer is formed by the same layer as a source/drain electrode of the TFT unit.

The second insulating film which requires a film thickness of about 2 to 3 μm in a conventional structure need only have a thickness large enough to cover stepped portions of the second conductive layer and to keep good switching characteristics of the TFTs. The second conductive layer can have a film thickness of about 0.3 μm to become a good film free from microcracks.

It is conventionally difficult to form contact holes for achieving an ohmic contact between the third and first conductive layers. However, according to the structure of the present invention, the contact holes can be formed by using the same process as that for forming contact holes for achieving an ohmic contact between the second and first conductive layers in the conventional structure. Thus, stable micropatterning can be performed by a simple process.

The dielectric portion is formed by only the first insulating layer without increasing the substrate size of the photoelectric conversion apparatus, thereby decreasing the thickness of the dielectric portion and increasing the capacitance of the accumulation capacitor. As a result, a photoelectric conversion apparatus which is not influenced by a noise component such as a stray capacitance formed between the conductive layer for holding a constant potential and the signal wirings can be realized.

The reading circuit of the photoelectric conversion apparatus of this embodiment is the same as that shown in FIG. 9, and its operation is also the same.

A detailed application of the embodiment of the photoelectric conversion apparatus of this embodiment is also the same as that shown in FIG. 6, and a description thereof will be omitted.

In a semiconductor device and a photoelectric conversion apparatus using the same according to the embodiment of the present invention described above, a matrix wiring unit is formed to have a multilayered structure of at least a first conductive layer, a first insulating layer, a second conductive layer, a second insulating layer, a semiconductor layer, and a third conductive layer in the order named, a charge accumulation means is formed to have a multilayered structure of at least the first conductive layer, the first insulating layer, and the second conductive layer, and the first conductive layer, the first insulating layer, and the second conductive layer of the matrix wiring unit and the charge accumulation means are commonly formed by the same layers.

As a result, there can be provided a semiconductor device and a photoelectric conversion apparatus which are free from crosstalk among output signals of matrix wirings, and have matrix wirings which are formed in a simple manufacturing process and have a low error rate. In addition, the capacitance of the charge accumulation means can be increased without increasing a substrate size, and the charge accumulation means can be formed in a simple process. Therefore, there can be provided a semiconductor device and a photoelectric conversion apparatus which can improve an S/N ratio, a dynamic range, and the like, can obtain stable characteristics, and can be rendered compact.

We claim:

1. A semiconductor device comprising:

m×n functional elements for processing signals, wherein m and n are each predetermined positive integers;

a matrix wiring section comprising a wiring lamination structure comprising plural wiring layers having at least, a first conductive layer, a first insulating layer provided on said first conductive layer, a second conductive layer provided on said first insulating layer, a second insulating layer provided on said second conductive layer, a semiconductor layer provided on said second insulating layer, and a third conductive layer provided on said semiconductor layer; and m×n switching means arranged such that said m×n functional elements transfer the signals to said matrix wiring section under control of said switching means, wherein said wiring section is provided on a common substrate with said switching means.

2. A semiconductor device according to claim 1, wherein said switching means comprises plural main electrodes, wherein said main electrodes of said switching means and said third conductive layer comprise a common conductive layer.

3. A semiconductor device according to claim 1, wherein said switching means comprises an insulated gate transistor comprising a switched lamination structure comprising plural switched layers having at least, a control electrode, a switched insulating layer provided on said control electrode, a switched semiconductor layer provided on said switched insulating layer and a main electrode provided on said switched semiconductor layer, wherein said control electrode is substantially coplanar with said second conductive layer, wherein said switched insulating layer is substantially coplanar with said second insulating layer, wherein said switched semiconductor layer is substantially coplanar with said semiconductor layer, and wherein said main electrode is substantially coplanar with said third conductive layer of said matrix wiring.

4. A semiconductor device with a photoelectric conversion function comprising:

m×n photoelectric conversion elements, m and n each being a predetermined positive integer; and a matrix wiring section comprising a matrix lamination structure comprising plural matrix layers having at least, a first conductive layer, a first insulating layer provided on said first conductive layer, a second conductive layer provided on said first insulating layer, a second insulating layer provided on said second conductive layer, a semiconductor layer provided on said second insulating layer, and a third conductive layer provided on said semiconductor layer; and m×n switching means, being organized into m blocks, arranged such that said photoelectric conversion elements transfer signals to said matrix wiring section under control of said switching means, said switching means and said matrix wiring being formed on a common substrate, and said switching being activated in each of the m blocks.

5. A semiconductor device according to claim 4, wherein said switching means comprises plural main electrodes, wherein said photoelectric elements comprise plural electrodes, and wherein said main electrodes of said switching means, said electrodes of said photoelectric elements, and said third conductive layer comprise a common conductive layer.

6. A semiconductor device according to claim 4, wherein said electric conversion elements comprise a photoconductive semiconductor layer, wherein said switching means comprises an insulating gate transistor comprising a switched laminating structure comprising plural switched layers having at least, a control electrode layer, a switched insulating layer provided on said control electrode, a switched semiconductor layer provided on said switched insulating layer, and a main electrode layer provided on said switched semiconductor layer, wherein said control electrode is substantially coplanar with said second conductive layer, wherein said switched insulating layer is substantially coplanar with said second insulating layer, wherein said switched semiconductor layer is substantially coplanar with said semiconductor layer, wherein said main electrode is substantially coplanar with said third conductive layer of said matrix wiring, and wherein said photoconductive semiconductor layer is substantially coplanar with said semiconductor layer of said matrix wiring.

7. A semiconductor device comprising:

m×n charge storage means for storing charges, m and n each being a positive integer;

a matrix wiring wherein said matrix wiring section and said charge storage means comprise a lamination structure comprising plural layers having at least, a first conductive layer, a first insulating layer provided on said first conductive layer, a second conductive layer provided on said first insulating layer, a second insulating layer provided on said second conductive layer, a semiconductor layer provided on said second insulating layer, and a third conductive layer provided on said semiconductor layer, and wherein each layer of said matrix wiring section and each layer of said charge storage means comprise a common layer; and m×n switching means arranged such that said charge storage means transfers the stored charges to said matrix wiring under control of said switching means, wherein said matrix wiring and said switching means are disposed on a common substrate.

8. A semiconductor device according to claim 7, wherein said switching means comprises an insulated gate transistor comprising a switched lamination structure having plural layers comprising at least, a control electrode, a switched insulating layer provided on said control electrode, a switched semiconductor layer provided on said switched insulating layer, and a main electrode provided on said switched semiconductor layer, wherein said control electrode is substantially coplanar with said second conductive layer, wherein said switched insulating layer is substantially coplanar with said second insulating layer, wherein said switched semiconductor layer is substantially coplanar with said semiconductor layer, and wherein said main electrode is substantially coplanar with said third conductive layer of said matrix wiring section and said charge storage means.

9. A semiconductor device comprising:
m×n photoelectric conversion elements wherein m×n are each predetermined positive integers;
charge storage means for storing signal charges photoelectrically converted by said photoelectric conversion elements;
a matrix wiring, wherein
said matrix wiring and said charge storage means comprise a wiring lamination structure having plural layers comprising a first conductive layer, a first insulating layer provided on said first conductive layer, a second conductive layer provided on said first insulating layer, a second insulating layer provided on said second conductive layer, a semiconductor layer provided on said second insulating layer, a third conductive layer provided on said semiconductor layer, and wherein each layer of said matrix wiring is in common with a respective layer of said charge storage means; and
m×n switching means arranged such that said storage means transfers the stored charges to said matrix wiring under control of said switching means, wherein said matrix wiring and said switching means are disposed on a common substrate.

10. A semiconductor device according to claim 9, wherein said photoelectric conversion comprises a photoelectric semiconductor layer,
said switching means comprises an insulated gate transistor comprising a switched lamination structure having plural layers comprising at least a control electrode, a switched insulating layer provided on said control electrode, a switched semiconductor layer provided on said switched insulating layer, and a main electrode provided on said switched semiconductor layer, wherein said control electrode is substantially coplanar with said second conductive layer, wherein said switched insulating layer is substantially coplanar with said second insulating layer, and wherein said switched semiconductor layer and said photoelectric semiconductor layer are disposed on a layer common to and continuous with said semiconductor layer of said matrix wiring.

11. A semiconductor device comprising:
m×n charge storage means for storing charges;
a matrix wiring section and wherein
at least a part of said matrix wiring section comprises a lamination structure having plural layers comprising a portion of:
a first conductive layer, a first insulating layer provided on said first conductive layer, a second conductive layer provided on said first insulating layer, a second insulating layer provided on said second conductive layer, a semiconductor layer provided on said second insulating layer, and a third conductive layer provided on said semiconductor layer;
wherein said charge storage means comprises plural layers at least, other portions of: said first conductive layer, said first insulating layer, and said second conductive layer; and
m×n switching means arranged such that said m×n charge storage means transfers the stored charges to said matrix wiring under control of said switching means.

12. A semiconductor device according to claim 11, wherein
said switching means comprises an insulated gate transistor comprising a switched lamination structure comprising plural switched layers comprising a control electrode, a switched insulating layer provided on said control electrode, a switched semiconductor layer provided on said switched insulating layer, a main electrode layer provided on said switched semiconductor layer, wherein said control electrode layer is substantially coplanar with said second conductive layer, wherein said switched insulating layer is substantially coplanar with said second insulating layer, and wherein said switched semiconductor layer is substantially coplanar with said semiconductor layer of said matrix wiring.

13. A photoelectric conversion device comprising:
a photoelectric conversion element;
a charge storage means for storing signal charges from the photoelectric conversion element;
a matrix wiring;
a switch means arranged such that said charge storage means transfer charges to said matrix wiring under control of said switch means,
wherein said matrix wiring and said switch means are disposed on a common substrate,
wherein said matrix wiring comprises a lamination structure comprising at least a first conductive layer, a first insulating layer provided on said first conductive layer, a second conductive layer provided on said first insulating layer, a second insulating layer provided on said second conductive layer, a semiconductor layer provided on said second insulating layer, and a third conductive layer provided on said semiconductor layer,
wherein said charge storage means comprises, at least, a fourth conductive layer disposed substantially coplanar with said first conductive layer, a third insulating layer provided on said third conductive layer and disposed substantially coplanar with said first insulating layer, and a fifth conductive layer provided on said third insulating layer and disposed substantially coplanar to said second conductive layer.

14. A device according to claim 13,
wherein said photoelectric conversion element comprises a photosensitive photo-conductive layer,
wherein said switch means comprises an insulated gate transistor comprising a switched lamination structure comprising at least, a control electrode, a switched insulating layer provided on said control electrode, a switched semiconductor layer provided on said switched insulating layer, and a main electrode provided on said switched semiconductor layer,
wherein said control electrode is formed from said second conductive layer,
wherein said switched insulating layer is formed from said second insulating layer, and
wherein said switched semiconductor layer and said photosensitive photoconductive layer are formed from a common layer continuous with said semiconductor layer of said matrix wiring.

15. A device according to claim 4, 9 or 13, wherein said photoelectric conversion element, said switch means, and said matrix wiring section are disposed adjacent to each other on said substrate.

16. A device according to claim 4, 9 or 13, wherein said semiconductor layer comprises an amorphous silicon.

17. A device according to claim 4, 9 or 13 wherein said first insulating layer comprises a material selected from the group consisting of a silicon oxide and a silicon nitride.

18. A device according to claim 4, 9 or 13 wherein said second insulating layer comprises a material selected from the group consisting of a polyamide, a silicon nitride, and silicon oxide.

19. A device according to claim 4, 9 or 13 wherein said matrix wiring section comprises a shield wiring.

20. A device according to claim 4 or 9, wherein said photoelectric conversion element, said charge storage means, said switch means, and said matrix wiring section are disposed adjacent to each other on said substrate.

21. A device according to claim 13, wherein said matrix wiring section comprises a matrix wiring provided on said charge storage means.

22. A device according to claim 4, 9 or 13, further comprising
a semiconductor device having a photoelectric conversion function comprising an input section; and
a power source for driving said semiconductor device.

23. An image reading apparatus comprising:
a semiconductor device with a photoelectric conversion function comprising:
m×n photoelectric conversion elements, m and n each being a predetermined positive integer,
a matrix wiring section comprising a matrix lamination structure comprising plural matrix layers having at least, a first conductive layer, a first insulating layer provided on said first conductive layer, a second conductive layer provided on said first insulating layer, a second insulating layer provided on said second conductive layer, a semiconductor layer provided on said second insulating layer, and a third conductive layer provided on said semiconductor layer, and
m×n switching means, being organized into m blocks, arranged such that said photoelectric conversion elements transfer signals to said matrix wiring section under control of said switching means, said switching means and said matrix wiring being formed on a common substrate, and said switching being activated in each of the m blocks;
a head for recording an image; and
a power source for driving the semiconductor device and the head.

24. An image reading apparatus comprising:
a semiconductor device comprising:
m×n photoelectric conversion elements wherein m×n are each predetermined positive integers,
charge storage means for storing signal charges photoelectrically converted by said photoelectric conversion element,
a matrix wiring, wherein said matrix wiring and said charge storage means comprise a wiring lamination structure having plural layers comprising a first conductive layer, a first insulating layer provided on said first conductive layer, a second conductive layer provided on said first insulating layer, a second insulating layer provided on said second conductive layer, a semiconductor layer provided on said second insulating layer, a third conductive layer provided on said semiconductor layer, and wherein each layer of said matrix wiring is in common with respective layer of said charge storage means, and
m×n switching means arranged such that said storage means transfers the stored charges to said matrix wiring under control of said switching means,
wherein said matrix wiring and said switching means are disposed on a common substrate;
a head for recording an image; and
a power source for driving the semiconductor device and the head.

25. An image reading apparatus comprising:
a semiconductor device comprising:
a photoelectric conversion element,
a charge storage means for storing signal charges from the photoelectric conversion element,
a matrix wiring,
a switch mean arranged such that said charge storage means transfers charges to said matrix wiring under control of said switch means,
wherein said matrix wiring and said switch means are disposed on a common substrate,
wherein said matrix wiring comprises a lamination structure comprises at least a first conductive layer, a first insulating layer provided on said first conductive layer, second conductive layer provided on said first insulating layer, second insulating layer provided on said second conductive layer, a semiconductor layer provided on said second insulating layer, and a third conductive layer provided on said semiconductor layer, and
wherein said charge storage means comprises, at least, a fourth conductive layer disposed substantially coplanar with said first conductive layer, a third insulating layer provided on said third conductive layer and disposed substantially coplanar with said first insulating layer, and a fifth conductive layer provided on said third insulating layer and disposed substantially coplanar to said second conductive layer;
a head for recording an image; and
a power source for driving the semiconductor device and the head.

* * * * *

UNITED STATES PATENT AND TRADEMARK OFFICE
CERTIFICATE OF CORRECTION

PATENT NO. : 5,061,979

DATED : October 29, 1991

INVENTOR(S) : ISAO KOBAYASHI ET AL.   Page 1 of 7

It is certified that error appears in the above-identified patent and that said Letters Patent is hereby corrected as shown below:

IN THE DRAWINGS

SHEET 10 OF 21

FIG. 11, "SHIFT RESISTER" should read --SHIFT REGISTER-- (all occurrences).

SHEET 11 OF 21

FIG. 13, "SHIFT RESISTER" should read --SHIFT REGISTER-- (all occurrences).

COLUMN 1

Line 24, "system" should read --system,--.
    Line 25, "apparatus" should read --apparatus,--.
    Line 29, "Circuits)" should read --Circuits),--.
    Line 65, "to" should be deleted and "hereinafter,)" should read --hereinafter),--.

COLUMN 3

Line 1, "lapse" should read --elapse--.
    Line 8, "to" should be deleted.
    Line 37, "contact hole" should read --contact hole 21--.
    Line 45, "potential" should read --potential,--.
    Line 51, "potential" should read --potential,--.

COLUMN 4

Line 24, "a" should read --an-- and "dimensions" should read --the dimensions--.

UNITED STATES PATENT AND TRADEMARK OFFICE
CERTIFICATE OF CORRECTION

PATENT NO. : 5,061,979
DATED : October 29, 1991
INVENTOR(S) : ISAO KOBAYASHI ET AL.

It is certified that error appears in the above-identified patent and that said Letters Patent is hereby corrected as shown below:

COLUMN 5

Line 19, "miro-" should read --micro- --.
Line 53, "contactness" should read --contact--.

COLUMN 6

Line 18, "are" should be deleted.
Line 27, "layer in the order named." should read
--layer.--.
Line 36, "¶ The" should read --The--.
Line 44, "a" should be deleted.
Line 47, "¶ The" should read --The--.
Line 51, "first conductive layer," should read
--first insulating layer,--.
Line 52, "first" should read --second--.
Line 53, "first" should read --second--.
Line 54, "conductive" (first occurrence) should read
--insulating--.
Line 66, "¶ The" should read --The--.

UNITED STATES PATENT AND TRADEMARK OFFICE
CERTIFICATE OF CORRECTION

PATENT NO. : 5,061,979
DATED : October 29, 1991
INVENTOR(S) : ISAO KOBAYASHI ET AL.         Page 3 of 7

It is certified that error appears in the above-identified patent and that said Letters Patent is hereby corrected as shown below:

COLUMN 7

Line 15, "¶ The" should read --The--.
Line 17, "layer provided on" should read --layer,--.
Line 18, "the first conductive layer, a first insulating layer," should read
--a first insulating layer provided on the first conductive layer,--.
Line 24, "layer the" should read --layer, and the--.
Line 25, "layer, and" should read --layer.--.
Line 26, "¶ The" should read --The--.
Line 39, "¶ The" should read --The--.
Line 40, "layer provided on" should read --layer,--.
Line 41, "the first conductive layer, a first insulating layer," should read
--a first insulating layer provided on the first conductive layer,--.
Line 43, "semi-" should be deleted.
Line 44, "conductor" should read --conductive--.
Line 45, "layer." should read --layer, and a third conductive layer provided on the semiconductor layer.--.
Line 46, "¶ Each" should read --Each--.
Line 49, "¶ The" should read --The--.

COLUMN 8

Line 13, "crosssectional" should read --cross-sectional--.
Line 16, "a" should read --an--.
Line 35, "sectional" should read --cross-sectional--.
Line 53, "EMBODIMENTS:" should read --EMBODIMENTS--.

UNITED STATES PATENT AND TRADEMARK OFFICE
CERTIFICATE OF CORRECTION

PATENT NO. : 5,061,979

DATED : October 29, 1991

INVENTOR(S) : ISAO KOBAYASHI ET AL.

It is certified that error appears in the above-identified patent and that said Letters Patent is hereby corrected as shown below:

COLUMN 9

Line 25, "¶ The" should read --The--.
    Line 36, "in which," should read --having--.
    Line 48, "¶ Each" should read --Each--.
    Line 49, "layer." should read --layer,--.
    Line 50, "The" should read --and the-- and "layer, and" should read --layer.--.
    Line 55, "¶ Steps" should read --Steps--.
    Line 67, "in which" should read --having--.

COLUMN 10

Line 2, "is" should be deleted.
    Line 3, "are" should be deleted.
    Line 38, "lapse" should read --elapse--.

COLUMN 11

Line 16, "layer the" should read --layer, the--.

COLUMN 13

Line 60, ",which" should read --which--.

COLUMN 14

Line 52, "electrode)" should read --electrode),--.

UNITED STATES PATENT AND TRADEMARK OFFICE
CERTIFICATE OF CORRECTION

PATENT NO. : 5,061,979
DATED : October 29, 1991
INVENTOR(S) : ISAO KOBAYASHI ET AL.

Page 5 of 7

It is certified that error appears in the above-identified patent and that said Letters Patent is hereby corrected as shown below:

COLUMN 15

Line 27, "capacitors CC1 to CC8" should read --capacitors CC1 to CC6--.

COLUMN 19

Line 11, "sectional" should read --cross-sectional--.

COLUMN 20

Line 10, "sectional" should read --cross-sectional--.
Line 33, "lapse" should read --elapse--.

COLUMN 21

Line 54, "sectional" should read --cross-sectional--.

COLUMN 22

Line 12, "n'-type" should read --n$^+$-type--.
Line 28, "conductive layer," should read --conductive layer, the second insulating layer,--.

UNITED STATES PATENT AND TRADEMARK OFFICE
CERTIFICATE OF CORRECTION

PATENT NO. : 5,061,979
DATED : October 29, 1991
INVENTOR(S) : ISAO KOBAYASHI ET AL.

It is certified that error appears in the above-identified patent and that said Letters Patent is hereby corrected as shown below:

COLUMN 23

Line 24, "sectional" should read --cross-sectional--.
Line 26, "sectional" should read --cross-sectional--.
Line 27, "sectional" should read --cross-sectional--.
Line 29, "sectional" should read --cross-sectional--.
Line 32, "sectional" should read --cross-sectional--.
Line 55, "sectional" should read --cross-sectional--.
Line 57, "sectional" should read --cross-sectional--.
Line 59, "sectional" should read --cross-sectional--.

COLUMN 24

Line 1, "lapse" should read --elapse--.

COLUMN 25

Line 19, "sectional" should read --cross-sectional--.
Line 46, "n'-type" should read --n$^+$-type--.

COLUMN 29

Line 7, "charges pho-" should read --charges, pho- --.
Line 29, "photoelectric conversion comprises" should read --photoelectric conversion elements comprise--.

COLUMN 30

Line 24, "transfer" should read --transfers--.
Line 44, "coplanar to" should read --coplanar with--.
Line 48, "photo-conductive" should read --photoconductive--.

UNITED STATES PATENT AND TRADEMARK OFFICE
CERTIFICATE OF CORRECTION

PATENT NO. : 5,061,979
DATED : October 29, 1991
INVENTOR(S) : ISAO KOBAYASHI ET AL.

It is certified that error appears in the above-identified patent and that said Letters Patent is hereby corrected as shown below:

COLUMN 31

Line 51, "switching" should read --switching means--.
Line 60, "m x n" should read --m and n--.

COLUMN 32

Line 1, "charges" should read --charges,--.
Line 33, "a switch mean" should read --switch means--.
Line 39, "comprises" should read --comprising--.
Line 41, "second" should read --a second--.
Line 42, "second" should read --a second--.
Line 55, "coplanar to" should read --coplanar with--.

Signed and Sealed this

Tenth Day of May, 1994

Attest:

BRUCE LEHMAN

Attesting Officer

Commissioner of Patents and Trademarks